(12) United States Patent
Blaesing-Bangert

(10) Patent No.: US 12,321,091 B2
(45) Date of Patent: Jun. 3, 2025

(54) DEVICE AND METHOD FOR DETERMINING PLACEMENTS OF PATTERN ELEMENTS OF A REFLECTIVE PHOTOLITHOGRAPHIC MASK IN THE OPERATING ENVIRONMENT THEREOF

(71) Applicant: Carl Zeiss SMT GmbH, Oberkochen (DE)

(72) Inventor: Carola Blaesing-Bangert, Kassel (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 780 days.

(21) Appl. No.: 17/394,464

(22) Filed: Aug. 5, 2021

(65) Prior Publication Data

US 2021/0364908 A1 Nov. 25, 2021

Related U.S. Application Data

(63) Continuation of application No. PCT/EP2020/052984, filed on Feb. 6, 2020.

(30) Foreign Application Priority Data

Feb. 6, 2019 (DE) .......................... 102019201497.6

(51) Int. Cl.
*G03F 7/20* (2006.01)
*G03F 1/24* (2012.01)

(52) U.S. Cl.
CPC ...................................... *G03F 1/24* (2013.01)

(58) Field of Classification Search
CPC ......... G03F 1/24; G03F 1/84; G02B 21/0016; G02B 21/16; G02B 21/241; G02B 27/32; G02B 21/32
See application file for complete search history.

(56) References Cited

U.S. PATENT DOCUMENTS 7,643,130 B2 1/2010 Yoshitake et al.
9,658,527 B2 5/2017 Dmitriev
(Continued)

FOREIGN PATENT DOCUMENTS

DE 102004010002 9/2005 ............... G03F 1/14
DE 102016204535 9/2017 ............... G01B 9/04
(Continued)

OTHER PUBLICATIONS

German Examination Report for Application No. 10 2019 201 497.6, dated Sep. 30, 2019 (with Machine Translation).
(Continued)

*Primary Examiner* — Mesfin T Asfaw
(74) *Attorney, Agent, or Firm* — Fish & Richardson P.C.

(57) ABSTRACT

The present application relates to a device for determining placements of pattern elements of a reflective photolithographic mask in the operating environment thereof, wherein the device comprises: (a) at least one first means configured for determining surface unevenness data of a rear side of the reflective photolithographic mask and/or surface unevenness data of a mount of the reflective photolithographic mask in a measurement environment that does not correspond to the operating environment; (b) at least one second means configured for determining placement data of the pattern elements in the measurement environment; and (c) at least one computing unit configured for calculating the placements of the pattern elements of the reflective photolithographic mask in the operating environment from the determined surface unevenness data of the rear side and/or of the mount and the determined placement data.

27 Claims, 15 Drawing Sheets

(56) References Cited

U.S. PATENT DOCUMENTS

| | | | |
|---|---|---|---|
| 9,753,366 B2 | 9/2017 | Dmitriev | |
| 2004/0227916 A1* | 11/2004 | Kono | G03F 7/703 |
| | | | 355/53 |
| 2007/0103659 A1 | 5/2007 | Yoshitake et al. | |
| 2009/0259431 A1 | 10/2009 | Yoshitake | |
| 2010/0129741 A1* | 5/2010 | Bijvoet | G03F 9/7003 |
| | | | 430/30 |
| 2010/0167189 A1 | 7/2010 | Del Puerto | |
| 2011/0255065 A1 | 10/2011 | Oshemkov et al. | |
| 2014/0192335 A1* | 7/2014 | Hagio | G03F 1/72 |
| | | | 355/52 |
| 2016/0179018 A1 | 6/2016 | Holzmann et al. | |
| 2017/0010540 A1 | 1/2017 | Dmitriev et al. | |
| 2017/0269347 A1 | 9/2017 | Jäckel et al. | |
| 2019/0377256 A1 | 12/2019 | Blaesing-Bangert | |

FOREIGN PATENT DOCUMENTS

| | | | |
|---|---|---|---|
| DE | 102017202945 | 8/2018 | ............... G03F 1/72 |
| DE | 102018206330 | 3/2019 | ............... G01B 11/30 |
| EP | 1 376 238 | 1/2004 | ............... G03F 7/20 |
| JP | 2008-103512 | 5/2008 | |
| JP | 2010-152031 | 7/2010 | |
| JP | 2015-064477 | 4/2015 | ............... G03F 1/84 |
| JP | 2017-517759 | 6/2017 | |
| KR | 1020110136495 | 12/2011 | |
| KR | 1020160052706 | 5/2016 | |
| KR | 10-1913020 | 10/2018 | |
| KR | 1020190117723 | 10/2019 | |
| TW | 201024927 | 7/2010 | ............... G03F 7/20 |
| WO | WO 2018/153654 | 8/2018 | ............... G03F 1/84 |

OTHER PUBLICATIONS

International Search Report and Written Opinion of the International Searching Authority for International Application No. PCT/EP2020/052984, dated Jun. 8, 2020.

Notice of Examination Opinion and Search Report issued by the Taiwan Intellectual Property Office for Taiwan Application No. 109103223, dated Jun. 16, 2021.

Ballman, K. et al., "Error Analysis of Overlay Compensation Methodologies and Proposed Functional Tolerances of EUV Photomask Flatness", *Proc. of SPIE*, vol. 9984, XXIII Symposium on Photomask and Next-Generation Lithography Mask Technology, (May 2016).

Brandstetter, G. et al., "Analytical treatment of the deformation behavior of extreme-ultraviolet-lithography masks during electrostatic chucking", *Journal of Micro/Nanolithography, MEMS, and MOEMS*, vol. 11, No. 4, pp. 043005-1-043005-10 (Oct.-Dec. 2012).

Tanaka et al., "Overlay accuracy of EUVl using compensation method for nonflatness of mask", *EUVL Symposium 2010*, MA-P07, (Oct. 18, 2010).

Vukkadala, P. et al., "Overview of IP error compensation techniques for EUVL", *Proc. of SPIE*, vol. 7545, 26th European Mask and Lithography Conference, pp. 754504-1-754504-11 (2010).

Notice of Reasons for Refusal issued by the Japanese Patent Office for Application No. JP 2021-546253, dated Aug. 10, 2022 (with English Translation).

Notice of Allowance issued by the Korean Patent Office for Application No. KR 10-2021-7028502, dated Mar. 6, 2025 (with English Translation).

* cited by examiner $$OPD_x = \Delta z * tan\emptyset * M$$

Φ = 6° in the EUV scanner

M = Magnification factor (1/4)

DEVICE AND METHOD FOR DETERMINING PLACEMENTS OF PATTERN ELEMENTS OF A REFLECTIVE PHOTOLITHOGRAPHIC MASK IN THE OPERATING ENVIRONMENT THEREOF

CROSS-REFERENCE TO RELATED APPLICATIONS

This application is a continuation of and claims priority under 35 U.S.C. § 120 from PCT Application No. PCT/EP2020/052984, filed on Feb. 6, 2020, which claims priority from German Application No. 10 2019 201 497.6, filed on Feb. 6, 2019. The entire contents of each of these priority applications are incorporated herein by reference.

TECHNICAL FIELD

The present invention relates to a method and a device for determining placements of pattern elements of a reflective photolithographic mask in the operating environment thereof.

BACKGROUND

As a consequence of the growing integration density in the semiconductor industry, photolithographic masks have to image increasingly smaller structures on wafers. In order to take account of this trend, the exposure wavelength of lithography apparatuses is being shifted to ever shorter wavelengths. Future lithography systems will probably operate at least in part with wavelengths in the extreme ultraviolet (EUV) range (preferably but not necessarily in the range of 6 nm to 15 nm). The EUV wavelength range places huge demands on the precision of optical elements in the beam path of future lithography systems. In all probability, the optical elements, and hence also the photolithographic masks in the EUV wavelength range, will be reflective optical elements. However, reflective optical elements are also usable for other wavelengths.

In the case of a photomask and in particular in the case of EUV masks, it is important that the pattern elements of the photomask exactly image the structure elements predefined by the design of a semiconductor component into the photoresist on a wafer. Only in this way is it possible that structures having dimensions in the nanometers range can be produced reproducibly on a wafer by use of a plurality of sequential processing processes and exposure processes using different masks. In accordance with the ITRS (International Technology Roadmap Semiconductor), satisfying the overlay requirements of photolithographic masks for future technology nodes is one of the most difficult challenges in lithography.

Owing to their layered construction, photolithographic masks for the EUV wavelength range have internal stresses. Here, the multilayer structure typically makes the largest individual contribution to an internal strain. The internal strain of an EUV mask leads to a curvature of the surface thereof. Normally, the internal strain of an EUV mask leads to a convex surface of the mask front side, i.e. the surface on which the multilayer structure and the pattern elements are arranged.

The German patent application DE 10 2016 204 535 A1 describes a method for calibrating a measurement microscope, which uses a calibration mask and a self-calibration algorithm to ascertain error correction data of the measurement microscope, which are used for the error correction of a photolithographic mask.

Currently, the placement of the pattern elements of conventional transmissive photomasks is measured by virtue of the produced photomasks being measured optically. During the measurement, the transmissive photomasks are typically mounted on three hemispheres and kept in position by the gravitational effect. The sagging of the newly produced masks, which is caused by their inherent weight, is ascertained with the aid of a finite element simulation and the placement errors of the pattern elements of the absorber structure caused by the sagging of the transmissive mask are corrected by computation.

The German patent application DE 10 2017 202 945 A1 describes a method by which the effects of the internal stresses and gravitation on the position of pattern elements upon the transition between different mounts or mountings of a reflective mask can be determined.

EUV masks will be used more and more in the foreseeable future. In this case, the EUV masks are used together with conventional transmissive masks in a common mask set (mix-and-match application). Since the EUV masks are used in particular for imaging critical structure elements on wafers, their contributions to the OPO (On-Product-Overlay) budget are becoming increasingly more important.

In an EUV stepper, an EUV mask is typically held on an electrostatic clamping device or electrostatic chuck (ESC). For this purpose, the rear side of the EUV mask is provided with an electrically conductive layer. This rear-side layer likewise causes stresses in the EUV mask. Moreover, the rear side of an EUV mask has small unevennesses. Said unevennesses can be caused by an imperfect planarity of the rear side of the mask substrate and/or by a not completely flat electrically conductive coating of the rear-side mask surface. Said unevennesses are at least partly transferred to the front side of the EUV mask during operation of the EUV mask by use of the electrostatic clamping device.

DE 10 2004 010 002 A1 describes a mask holder for EUV masks, having a multiplicity of supporting elements for the mask, wherein each supporting element is embodied such that it is able to be electrically biased individually.

The documents cited by way of example below analyze rear-side unevennesses of EUV masks: P. Vukkadala, D. Patil and R. I. Engelstad: "Overview of IP error compensation techniques for EUVL," Proc. of SPIE, Vol. 7545, 26th European Mask and Lithography Conference, 75404-11-75404-11; O. Tanaka et al.: "Overlay accuracy of EUV1 using compensation method for nonflatness of mask," EUVL Symposium, MA-P07, October 2010; K. Ballman. C. Lee, T. Dunn and A. Bean: "Error analysis of overlay compensation methodologies and proposed functional tolerances of EUV photomask flatness," Proc. of SPIE, Vol. 9984, XXIII Symposium on Photomask and Next-Generation Lithography Mask Technology, May 2016, doi: 10.1117/12.2242282; and G. Brandstetter and S. Govindjee: "Analytical treatment of the deformation behavior of extreme-ultraviolet lithography masks during electrostatic chucking," J. of Micro/Nanolithography, MEMS, and NOEMS, Vol. 11(4), October-December 2012, pages 043005-1-043005-10.

Ascertaining the placement of pattern elements on EUV masks and reproducibly determining the front- and rear-side unevenness of EUV masks constitute metrological challenges.

The present invention addresses the problem of specifying a device and a method which make it possible at least partly to meet the challenges described.

SUMMARY

According to one exemplary embodiment of the present invention, this problem is solved by a device in accordance with claim 1 and by a method according to claim 17. In one embodiment, a device for determining placements of pattern elements of a reflective photolithographic mask in the operating environment thereof comprises: (a) at least one first means configured for determining surface unevenness data of a rear side of the reflective photolithographic mask and/or surface unevenness data of a mount of the reflective photolithographic mask in a measurement environment that does not correspond to the operating environment of the reflective photolithographic mask; (b) at least one second means configured for determining placement data of the pattern elements in the measurement environment; and (c) at least one computing unit configured for calculating the placements of the pattern elements of the reflective photolithographic mask in the operating environment from the determined surface unevenness data of the rear side and/or of the mount and the determined placement data.

A device according to the invention makes it possible to determine rear-side unevennesses of reflective photolithographic masks. Generally, a device according to the invention makes it possible to take account of the effects of the unevennesses of an EUV mask and/or of a holder of the EUV mask, which is used for holding or fixing the EUV mask in a measurement environment, on the positions of the pattern elements in an operating environment of the reflective photolithographic mask upon transition from the measurement environment to the operating environment. As a result, the contribution of a reflective photolithographic mask to an OPO (On-Product-Overlay) budget can be determined with greater precision. Since reflective photomasks are principally used for critical process steps on account of the structure dimensions of their pattern elements in a mask stack, on the basis of reflective photomasks whose pattern element placements have been determined with greater accuracy, it is possible to optimize the overlay of two or more reflective photomasks and/or of one or more reflective photomasks with one or more transmissive photomasks. As a result, it is thereby possible to increase the yield of a semiconductor component production process based on a mix-and-match mask set, for example.

The rear side of the reflective photolithographic mask is opposite to a front side of the reflective photolithographic mask, which has the pattern elements.

A device according to the invention can also be used for determining the placements of pattern elements of all kinds of conventional transmissive photomasks.

The at least one second means can additionally be configured to determine surface unevenness data of a front side of the reflective photolithographic mask, and the computing unit can furthermore be configured to take account of the determined surface unevenness data of the front side for calculating the placements of the pattern elements.

The at least one first means and/or the at least one second means can be configured to obtain the surface unevenness data of the rear side, of the front side of the reflective photolithographic mask and/or of the mount and also the placements of the pattern elements from one or more external measuring devices. The at least one first means and/or the at least one second means can take the surface unevenness data of the rear side, of the front side of the reflective photolithographic mask and/or of the mount and also the placements of the pattern elements from a memory.

In a first exemplary embodiment, a device defined in this application can comprise an interface via which the device can obtain measurement data, for example surface unevenness data of the rear side and/or of the front side of a reflective photolithographic mask and/or surface unevenness data of the mount of the reflective photolithographic mask, from one or more external measuring devices. The interface can comprise a wired or a wireless interface. Furthermore, the device can obtain measurement data describing placements of pattern elements from a further external measuring device.

The mount of the reflective photolithographic mask can comprise a chuck. The chuck can comprise a vacuum chuck (VC) or an electrostatic chuck (ESC). The mount can have a surface for holding the reflective photolithographic mask. The surface for holding or fixing the reflective photolithographic mask can comprise a flat surface. The surface for holding the reflective photolithographic mask can have unevennesses. The unevennesses of the surface of the mount can comprise local unevennesses. The local unevennesses can have deviations with respect to a mean surface of the mounts in a range of 0.1 nm to 20 nm.

In a measurement environment, an EUV mask can be held or fixed in two different ways. Firstly, the EUV mask can be mounted on a three-point mount and, secondly, the EUV mask can be fixed with the aid of a chuck in a measurement environment.

The at least one first means can comprise a first measuring unit configured for ascertaining the surface unevenness data in an environment that does not correspond to the operating environment.

In its operating environment, a reflective photomask is typically held in its position by use of an electrostatic chuck. In this arrangement, directly determining the rear-side unevennesses of a reflective photolithographic mask is not possible.

The at least one first means can comprise at least one third measuring unit configured for determining the surface unevenness data of the mount. The at least one third measuring unit can comprise a profilometer. The profilometer can use tactile or optical methods. The profilometer can use at least one technique from the following group: confocal technique, laser profilometry and white light interferometry. The at least one third measuring unit for determining the surface unevenness data of the mount can comprise an interferometer.

The at least one second means can comprise a second measuring unit configured for ascertaining the placement data of the pattern elements in an environment that does not correspond to the operating environment.

As already explained above, a reflective mask in its operating environment is held in its position as standard by an electrostatic chuck. By contrast, during part of the mask production process, a reflective mask is normally fixed in a three-point mount by the action of the gravitational force.

The second measuring device can be configured for determining coordinates of the pattern elements of the reflective photolithographic mask.

The second measuring unit can be configured for ascertaining the placement data of the pattern elements in an environment that at least partly corresponds to the operating environment.

It is possible for the second measuring unit to have a chuck that fixes the reflective photolithographic mask in a manner substantially corresponding to the fixing of the reflective mask in the operating environment thereof. Furthermore, the second measuring unit can be configured to simulate one or more further parameters of the operating environment of a reflective photolithographic mask. Further parameters of the operating environment can be: the temperature, the air pressure and/or the air humidity of the operating environment. If the operating environment corresponds to a vacuum environment, the air pressure and the air humidity relate to a remaining residual pressure and a remaining residual humidity in the vacuum environment.

Here and elsewhere in this description, the expression "substantially" denotes an indication of a measurement variable within the conventional measurement errors if measuring appliances according to the prior art are used to determine the measurement variable.

The at least one second means of the device for determining placements of pattern elements of a reflective photolithographic mask can be configured for determining surface unevenness data of the front side of the reflective photolithographic mask. The at least one second means can comprise a fourth measuring unit configured for ascertaining the surface unevenness data of the front side of the reflective photolithographic mask in an environment that does not correspond to the operating environment. The fourth measuring unit can be configured for ascertaining the surface unevenness data of the front side in an environment that corresponds to the operating environment. The first measuring unit can comprise the fourth measuring unit. Furthermore, the second measuring unit can comprise the fourth measuring unit.

The computing unit can be configured to transform the obtained surface unevenness data of the rear side, of the front side and/or of the mount and the obtained placement data in order to determine the surface unevenness data and in order to determine the placement data.

If the surface unevenness data of the rear side and/or of the front side and the placement data are ascertained by different units or different measuring units, it is necessary to convert the measurement data of the two metrology tools precisely in relation to one another.

The computing unit can be configured to determine the placements of the pattern elements with respect to a mount of the reflective photolithographic mask in the operating environment.

The computing unit can be configured to determine at least one deviation of the placements of the pattern elements with respect to the design data in the operating environment.

The computing unit can furthermore be configured to determine from the at least one deviation of the placements of the pattern elements and/or from the determined surface unevenness data at least one arrangement of pixels which corrects the at least one deviation and/or the rear-side surface unevenness.

One embodiment of the device described above can thus be used for correcting determined deviations of the placements of the pattern elements of a reflective photolithographic mask relative to placements predefined by the design by use of a targeted lateral displacement of one or more pattern elements. It is advantageous here to relate the correction to the operating environment of the mask since the mask is used in this environment. Alternatively or additionally, it is possible to compensate for the determined rear-side surface unevenness by introducing or writing one or more arrangements of pixels into the mask substrate.

The computing unit can be configured to determine the placements of the pattern elements with respect to a surface of the mount of the reflective photolithographic mask in the operating environment. The mount of the reflective photolithographic mask in the operating environment can comprise an electrostatic chuck.

The computing unit can be configured to determine the placements of the pattern elements of the reflective photolithographic mask with respect to an electrostatic chuck with a surface assumed to be ideally flat in the operating environment.

In the case where a mask is fixed on an electrostatic chuck or a vacuum chuck, it is assumed that the chuck can exert on the reflective mask a force having a magnitude such that the rear side of said mask bears substantially over the whole area on the surface of the chuck. This means that in the case where a reflective mask is fixed in a chuck, the rear-side surface unevennesses of the mask are concealed or eliminated by the surface unevennesses of the chuck.

As explained above, a reflective mask can be held in a measurement environment for example by use of a three-point mount or by use of a chuck. The surface of a chuck which holds or fixes a reflective photolithographic mask is not perfectly flat. The unevennesses of the surface of a chuck propagate at least in attenuated form through the mask and lead to alterations of the placements of the pattern elements mounted on the front side of the EUV mask.

As likewise already explained above, reflective photolithographic masks are typically held by an electrostatic chuck during their operation, i.e. in their operating environment, i.e. in an exposure system of a lithography device. The fixing of the reflective photolithographic mask in an operating environment is often related to a surface of an ESC that is assumed to be ideally flat. If a reflective mask is fixed in the measurement environment with the aid of a VC or ESC, the device specified above transforms the ascertained placement data into that surface of an ESC which is assumed to be ideally planar in the operating environment. This means that existing surface unevennesses of a chuck in a measurement environment are corrected computationally with respect to that surface of the ESC used in the operating environment which is assumed to be ideally flat.

Determining the surface unevenness data of the rear side, of the front side and/or of the mount and the placement data can comprise obtaining these data from an external device and/or can comprise ascertaining the surface unevenness data of the rear side, of the front side and/or of the mount and the placement data by use of one or more measuring units of the device.

The device for determining placements of pattern elements can furthermore comprise: a mask rotating unit configured to position the reflective photolithographic mask such that the front side thereof and the rear side thereof are interchanged.

When rotating or flipping a reflective photomask, it should be taken into consideration that said photomask is permitted to be held only in specific regions, in order to avoid contamination of the reflective mask or the production of defects in the active region thereof.

The first measuring unit and/or the fourth measuring unit can comprise a focus system configured to ascertain the surface unevenness data of the reflective photolithographic mask.

Focusing a light beam onto the rear side and/or the front side of a reflective photomask in order to determine the rear-side and/or front-side unevenness, respectively, makes it possible to ascertain the unevennesses with a high lateral resolution, since averaging a light beam over a relatively large area of the rear side and/or the front side of the reflective mask does not occur. The accuracy when determining the unevenness of the rear side of the mask and/or of the front side of the mask can be set by means of the choice of the lateral spacings of the scanning points.

The second measuring unit can comprise a focus system configured to ascertain the placement data of the pattern elements.

The second measuring unit can be configured to automatically ascertain the surface unevenness data of the rear side and/or of the front side of a reflective photomask and the placement data thereof.

The reflective photolithographic mask can have an electrically conductive coating of the rear side.

The focus system of the first, second and/or fourth measuring unit can comprise an autofocus system for automatically ascertaining the unevenness data of the rear side, of the front side and/or the placement data of the pattern elements. In an alternative embodiment, the first, the second and/or the fourth measuring unit can determine the unevenness data of the rear side, of the front side and/or the placement data of the pattern elements by use of focus stack measurements.

An electrically conductive coating serves for mounting or fixing a reflective mask in the operating environment thereof by use of an electrostatic chuck. An electrically conductive coating typically comprises a metal or a metal alloy. An electrically conductive coating of the rear side of the reflective mask typically acts as a mirror for light from the visible or the ultraviolet wavelength range of the electromagnetic spectrum.

The reflective photolithographic mask can comprise a photolithographic mask for the extreme ultraviolet (EUV) wavelength range. At the present time, a wavelength range of 10 nm to 15 nm is preferably used within the EUV range.

The front side of a reflective photolithographic mask can comprise marks or alignment marks that are used for ascertaining the placement data of the pattern elements. The alignment marks can be mounted in a regular or an irregular grid on a reflective mask. The alignment marks can be used by themselves or in combination with the pattern elements for ascertaining the placement data of the pattern elements. However, it is also possible to use exclusively the pattern elements themselves for ascertaining the position thereof on the reflective photolithographic mask.

The first measuring unit can comprise a first light source for a visible wavelength range and/or a second light source for a deep ultraviolet wavelength range.

The second measuring unit can comprise a third light source for the visible wavelength range and/or a fourth light source for the deep ultraviolet wavelength range.

The first, second, third and/or fourth light source can comprise a laser system or a lamp, e.g. an LED (Light Emitting Diode). The first and third light sources can comprise a helium-neon laser. The second and fourth light sources can comprise an argon fluoride laser. The first, second, third and/or fourth light source can comprise a numerical aperture (NA) in the range of 0.1 to 0.98, preferably 0.1 to 0.95, more preferably 0.1 to 0.92, and most preferably 0.1 to 0.9. At the present time, use is preferably made of light sources in the visible wavelength spectrum which have an NA in the range of 0.1 to 0.4, or light sources in the deep ultraviolet (DUV) wavelength range, for instance laser systems, which emit at 193 nm and which have an NA in the range of 0.4 to 0.9.

The first and/or the third light source can comprise a wavelength in the range of 10 nm to 15 nm and have a line width of <1 nm. The first and third light sources or the second and fourth light sources can be embodied as one light source.

It is advantageous to use photons having the shortest possible wavelength for ascertaining the placement of pattern elements of reflective masks and ascertaining the surface unevennesses of the rear side and/or of the front side of reflective masks, since the resolving power of the device or of a measuring device increases as the wavelength of the light source(s) used decreases. At the present time, the lack of availability of EUV light sources still largely prevents the use of measuring devices that operate at the actinic wavelength of reflective masks.

The first measuring unit can comprise at least one first detector, and the second measuring unit can comprise at least one second detector. The at least one first detector and the at least one second detector can comprise a CCD (Charged Coupled Device) detector.

The first measuring unit can ascertain the surface unevenness data of the rear side and the second measuring unit can ascertain the placement data of the pattern elements without altering a position of the reflective photolithographic mask. Furthermore, it is possible for the first measuring unit to determine the surface unevenness data of the rear side and for the second measuring unit to determine the placement data of the pattern elements and, in its function as fourth measuring unit, the surface unevenness data of the front side, without altering the position or the location of the reflective photolithographic mask.

These embodiments of the device defined above have the advantage that the measurement data can be related to one another in a simple manner. Furthermore, these embodiments are advantageous since all measurements can be carried out in the same mounting state of the reflective photolithographic mask and some potential error sources cannot occur as a result.

The computing unit can be configured to take account of a deformation of the reflective photolithographic mask on account of the holding of the reflective photolithographic mask in the measurement environment. In the measurement environment, the reflective photolithographic mask can be held for example in a three-point mount or by use of a chuck. The surface unevenness data of the rear side and/or of the front side and/or the placement data of the reflective photolithographic mask can be determined in the measurement environment.

In the case of a three-point mount of a mask, irrespective of the type of mask under consideration, sagging of the photomask occurs on account of the inherent weight thereof; this phenomenon is referred to in the art as "Mask Sagging." For transmissive photomasks, the computing unit of the device can carry out a finite element simulation of the mask substrate in order to determine the sagging of the mask in the case of the three-point mount. For reflective masks, the second measuring unit can determine a height profile of the mask. The second measuring unit can ascertain a height profile of the front side and/or of the rear side of the reflective masks. Furthermore, the second measuring unit, in its function as fourth measuring unit, can determine unevennesses of the front-side surface of a reflective photolithographic mask. The first measuring unit can likewise be configured to ascertain a height profile of the rear side of the reflective mask.

In the case where the reflective photolithographic mask is fixed by use of a VC or an ESC, it is possible to use the first or the second measuring unit in a measurement environment for determining the placement of the pattern elements.

It is preferred for the second measuring unit to measure not only the coordinates of the pattern elements of the reflective mask, i.e. the xy-coordinates, but also the height information thereof, i.e. the z-coordinate. The three-dimensional measurement data set ascertained can then be used by the computing unit for calculating the placements of the pattern elements.

The second measuring unit can carry out the process of determining the height profile or a surface contour of the reflective mask simultaneously with the process of ascertaining the coordinates of pattern elements. However, it is also possible for the second measuring unit to carry out the process of ascertaining the height profile by use of a separate measurement. Ascertaining the height profile and optionally determining the unevennesses of the front-side surface of a reflective photomask can be carried out during a period of temperature regulation of the reflective photolithographic mask in the device.

Furthermore, it is possible for the second measuring unit to automatically concomitantly measure the height profile of the reflective mask during the process of ascertaining the placement data. If the placement measurement does not comprise enough measurement points to determine the height profile with a predefined accuracy, the surface contour of the reflective mask can be determined in a separate measurement for example by use of a focus measurement carried out by the second measuring unit. Since the separate determination of the height profile can be carried out for example during a temperature-regulating phase of the EUV mask in the device or the second measuring unit, determining the surface contour typically does not lead to a lengthening of the measurement time for the reflective mask in the device.

The second measuring unit can be configured to radiate substantially perpendicularly onto the front side of the reflective photolithographic mask and the first measuring unit can be configured to radiate substantially perpendicularly onto the rear side of the reflective photolithographic mask.

This embodiment of the device defined above makes it possible to ascertain the placements of the pattern elements and to ascertain the rear-side unevennesses of a reflective mask without altering the position or location of the mask. This facilitates the conversion of the two data sets or the transformation thereof into a common plane or into a common coordinate system.

The device can comprise a three-point mount for holding the reflective photolithographic mask. Furthermore, the device can comprise an electrostatic chuck for holding the reflective photolithographic mask in a measurement environment.

The at least one first means can furthermore be configured to receive surface unevenness data of a mount of the reflective photolithographic mask in the measurement environment.

The computing unit can furthermore be configured to take account of unevenness data of the mount of the reflective photolithographic mask in the measurement environment when calculating the placements of the pattern elements in the operating environment.

The computing unit can obtain unevenness data of an ESC or of a VC that holds or fixes the reflective mask in a measurement environment, in order to combine these data obtained for the purpose of calculating the placements of the pattern elements in the operating environment of the reflective mask.

The computing unit can be configured to take account of the gravitation effect on the reflective photolithographic mask during the process of ascertaining the placement data and/or during the process of ascertaining the surface unevenness data of the rear side and/or of the front side.

The computing unit can be configured to determine the gravitation effect on the reflective photolithographic mask by carrying out a finite element simulation.

Besides the internal stresses, the effect of gravitation also contributes to a deformation of the reflective photolithographic mask in the case of the three-point mounting thereof in the device defined above. Since both the individual contributions to the deformation of a reflective mask and the overall deformation lie within the linear deformation range of a reflective mask, the individual contributions can be determined independently of one another and taken into account independently of one another in terms of their effect.

The computing unit can be configured, for the purpose of calculating the placements of the pattern elements, to determine a change in position of a neutral axis of the reflective photolithographic mask upon the transition from a measurement environment that does not correspond to the operating environment of the reflective photolithographic mask into the operating environment. In the measurement environment that does not correspond to the operating environment of the reflective photolithographic mask, the reflective photolithographic mask can be fixed by use of a three-point mount.

A neutral axis denotes, in a body, for example a beam or a plate, a plane at which a compressive stress transitions into a tensile stress. The neutral axis is free of forces. The neutral plane of a photomask can be described at each point of the mask by gradients or local tangents in the x- and y-directions.

The change in position of the neutral axis can be ascertained on the basis of three-dimensional placement data.

Firstly, a change in the internal stresses of a photolithographic mask leads to a change in the positions of the pattern elements on the surface of the reflective mask. Secondly, a change in the stress state of a reflective mask is manifested in a change in the height profile and consequently also in the position of the neutral axis of a reflective mask. Therefore, from a change in the surface contour, it is possible to deduce a change in the position of the neutral axis, which can be used for calculating the placements of the pattern elements in the operating environment.

Determining the change in position of the neutral axis in the case of a three-point mount can comprise ascertaining a change in a magnification of the reflective mask in the measurement environment or the device with respect to the operating environment. Ascertaining the change in a magnification can comprise determining an isotropic magnification factor and/or can comprise determining at least two magnification factors which cover an anisotropic magnification of the reflective mask in the device. Determining the change in the position of the neutral axis can be carried out by the computing unit of the device.

The computing unit can additionally be configured to take account of obtained and ascertained surface unevenness data of the rear side and/or of the front side when calculating the placements of the pattern elements. The computing unit can be configured, moreover, to take account of obtained and ascertained placement data when calculating the placements of the pattern elements.

Determining the change in the position of the neutral axis can comprise: reading out the change in position of the neutral axis from a database comprising the positions of the neutral axes of different types of reflective photolithographic mask.

The device for determining placements of pattern elements of a reflective photolithographic mask can comprise a non-volatile memory. Models for different types of reflective mask can be stored in the non-volatile memory, said models describing how unevennesses of the rear side of the reflective mask in a three-point mount affect the placement of the pattern elements of the reflective masks in the operating environment thereof. The computing unit can use the stored models for calculating the placements of the pattern elements of the reflective mask.

The device for determining placements of pattern elements of a reflective photolithographic mask can furthermore comprise a unit for determining a refractive index of a medium present in the device. Said unit can comprise for example an etalon composed of Zerodur®. In order to increase the precision of the refractive index determination, the change in the length of the etalon as a result of material aging and/or as a result of pressure-dependent compression can be taken into account computationally. The material aging is a maximum of 0.15 ppm/a (parts per million per annum) and should as far as possible always be taken into account. The medium can comprise air. The unit for determining the refractive index at least can comprise at least one interferometer.

Furthermore, the device can comprise a laser system configured to introduce the at least one arrangement of pixels into a substrate of the reflective photolithographic mask. The laser system can be configured to generate light pulses having a time duration ranging from the picoseconds range to the femtoseconds range. Furthermore, the laser system can comprise a focusing unit configured to arrange a focus of a light beam at a predefined depth in the mask substrate. Moreover, the laser system can comprise a scanning unit configured to direct the light pulses of the laser system onto predefined positions of the substrate of the reflective photolithographic mask in order to generate the at least one arrangement of pixels.

In one embodiment, a method for determining placements of pattern elements of a reflective photolithographic mask in the operating environment thereof comprises the following steps: (a) determining surface unevenness data of a rear side of the reflective photolithographic mask and/or surface unevenness data of a mount of the reflective photolithographic mask in a measurement environment that does not correspond to the operating environment; (b) determining placement data of the pattern elements in the measurement environment; and (c) calculating the placements of the pattern elements in the operating environment from the determined surface unevenness data of the rear side and/or of the mount and the determined placement data.

Determining the surface unevenness data can comprise ascertaining the surface unevenness data by use of a first measuring unit, determining the placement data can comprise ascertaining the placement data of the pattern elements by use of a second measuring unit, and the surface unevenness data and the placement data can be ascertained in a common measurement process.

Determining the surface unevenness data can comprise ascertaining the surface unevenness data of the rear side and/or of the front side of a reflective photolithographic mask.

Determining the surface unevenness data can be carried out in a temperature-regulating phase of the reflective photolithographic mask. The temperature-regulating phase of the reflective photolithographic mask can be effected in the device defined above. The temperature-regulating phase of the reflective photolithographic mask can be effected in a first measuring unit and/or a second measuring unit of the device defined above.

Determining the surface unevenness data and determining the placement data can be carried out without a change in the position of the reflective photolithographic mask.

The method for determining placements of pattern elements of a reflective photolithographic mask can furthermore comprise the step of: determining surface unevenness data of the front side of the reflective photolithographic mask.

In addition, the method for determining placements of pattern elements of a reflective photolithographic mask can comprise the step of: introducing at least one arrangement of pixels into a substrate of the reflective photolithographic mask which corrects at least one deviation of the placements of the pattern elements and/or of the rear-side surface unevenness in the operating environment.

A computer program can contain instructions which, when executed by a computer system, cause the computer system to carry out the method according to one of the above-described aspects.

DESCRIPTION OF DRAWINGS

The following detailed description describes currently preferred exemplary embodiments of the invention, with reference being made to the drawings, in which.

DETAILED DESCRIPTION

An explanation is given below of currently preferred embodiments of a device according to the invention and of a method according to the invention on the basis of a reflective photolithographic mask for the extreme ultraviolet (EUV) wavelength range, the pattern elements of which comprise absorbing material. However, a device according to the invention for determining placements of pattern elements of a reflective photolithographic mask is not restricted to the examples discussed below. Rather, said device can be used in the same way for determining placements of pattern elements of different types of EUV masks, in particular for example for determining placements of pattern elements of phase-shifting EUV masks. Furthermore, a reflective photomask is not restricted to the EUV wavelength range. Moreover, a device according to the invention can generally be used for determining placements of pattern elements in an operating environment of a reflective photomask, wherein the placements are determined in an environment that does not correspond to the operating environment. Finally, a device according to the invention and a method according to the invention are suitable for determining the placements of all types of conventional transmissive photomasks.

Figure 1:
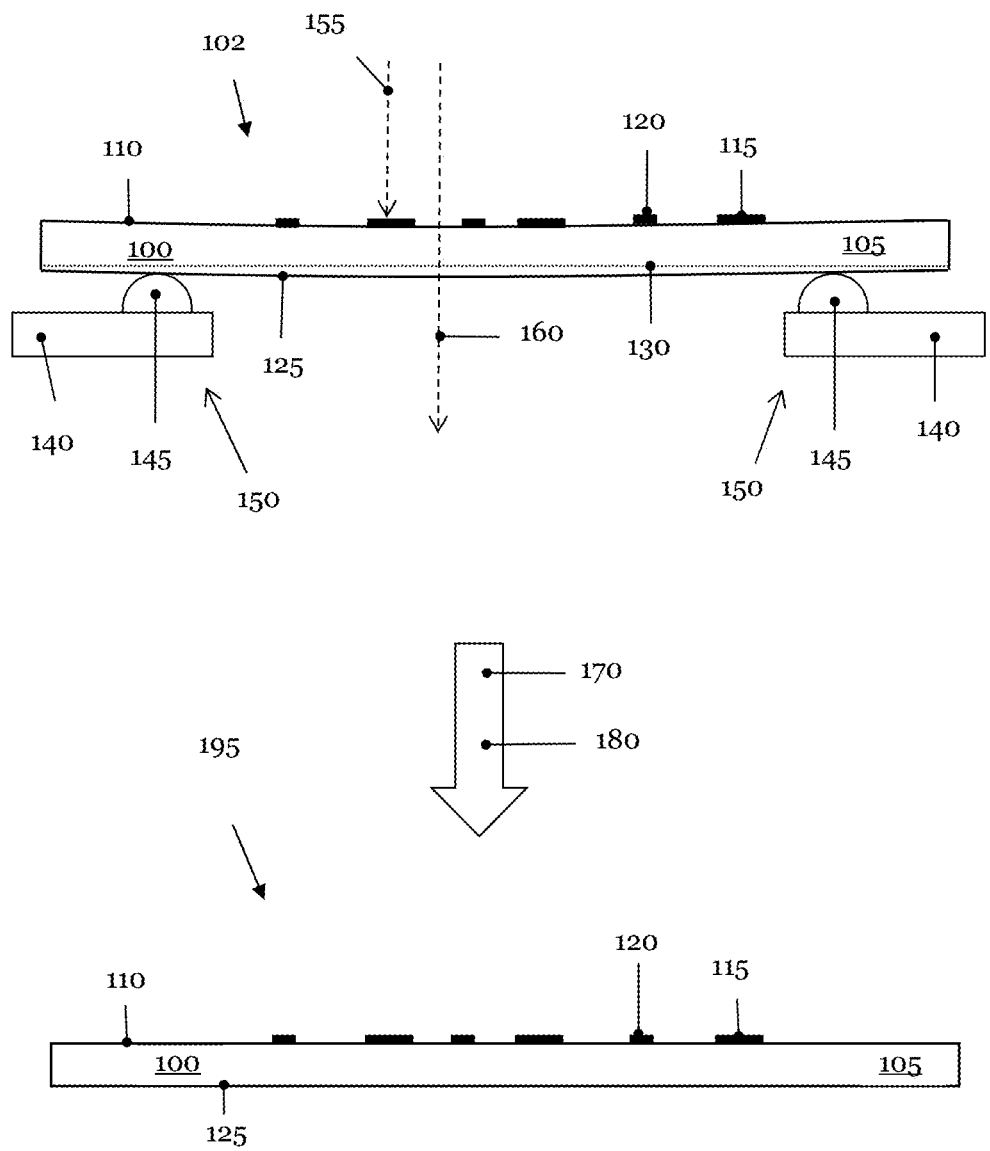
FIG. 1 shows, in the upper partial image, schematically a section through a conventional transmissive photolithographic mask according to the prior art, said mask being mounted on three hemispheres, and presents, in the lower partial image, the photolithographic mask from the upper partial image, the sagging of which on account of the gravitation effect has been corrected.

In the upper partial image 102, FIG. 1 shows a schematic section through a conventional transmissive photomask 100 according to the prior art. The photomask 100 comprises a transmissive substrate 105, for example composed of quartz, and absorbent pattern elements 115 and 120 arranged on a front side 110 of the mask 100. Typically, the substrate 105 of a transmissive photomask 100 has a thickness of 6.35 mm. Conventional photomasks 100 often have lateral dimensions (i.e., dimensions in the mask plane) of 152 mm×152 mm. Preferably, at the present time an area of a maximum of 142 mm×142 mm is used for imaging the pattern elements 115, 120 onto a wafer (active area of the photomask 100). Pattern elements 115 and 120 are arranged within this region.

Transmissive photomasks 100 are often mounted in punctiform fashion on three spheres or hemispheres during the production of the pattern elements 115, 120 and during the measurement of the positions of the produced pattern elements 115, 120. The upper partial image 102 of FIG. 1 reproduces a section through two of the three hemispheres or resting spheres 145. The three hemispheres or resting spheres 145 are part of a three-point mount 140 which fixes the photomask 100. In general, the three-point mount 140 is firstly used during the production thereof and the measurement of the photomask 100 produced and thus corresponds to a measurement environment 150. Secondly, a transmissive mask 100 is held by a three-point mounting or three-point mount 140 during its operation in a scanner, that is to say that a three-point mount 140 is likewise used in an operating environment of the transmissive mask 100. The dashed arrows 155 and 160 illustrate the incidence of actinic radiation on the photomask 100. Radiation 155 incident on an absorbent pattern element 115, 120 is absorbed. Radiation 160 incident on the substrate 105 of the mask 100 penetrates through the substrate 105 or the mask 100 and leaves the rear side 125 thereof substantially without being attenuated.

As indicated by the dotted line 130 in the vicinity of the rear side 125 of the mask 100, the photomask 100 bends during the production of the mask 100, during the measurement of the pattern elements 115, 120 and during the operation of the mask 100 on account of its mass owing to the effect of gravitation. The sagging of a mask in a three-point mount is referred to in the art as "Mask Sagging." The bending of the photomask 100 slightly changes the positions of the pattern elements 115, 120 in comparison with a mask 100 which has no bending or curvature of the substrate 105. The lower partial image 195 from FIG. 1 presents the photomask 100 from the upper partial image 105, the substrate 105 of which is planar. The pattern elements 115, 120 of the photomask 100 from the lower partial image 195 have a small lateral displacement by comparison with the photomask 100 illustrated in the upper partial image 105 of FIG. 1.

The perpendicular arrow 170 in FIG. 1 symbolizes a finite element simulation 180 of the substrate 105 of the photomask 100. The finite element simulation 180 of the substrate 105 of the photomask 100 is carried out to determine the effect of gravity on the substrate 105 of the photomask 100 in the three-point mount 140 of the photomask 100 illustrated in the upper partial image 102 of FIG. 1. At the same time, the finite element simulation 180 is used to ascertain the positions of the pattern elements 115, 120 on the flat front side 110 of the mask on the basis of the pattern elements 115, 120 measured in the upper partial image 102. As a result of the correction of the sagging of the mask 100, the placement of the pattern elements 115, 120 is related to a planar substrate 105 of the mask 100.

When carrying out the finite element simulation 180, the conventional photomask 100 can be replaced, to a good approximation, by the substrate 105 thereof.

Figure 2:
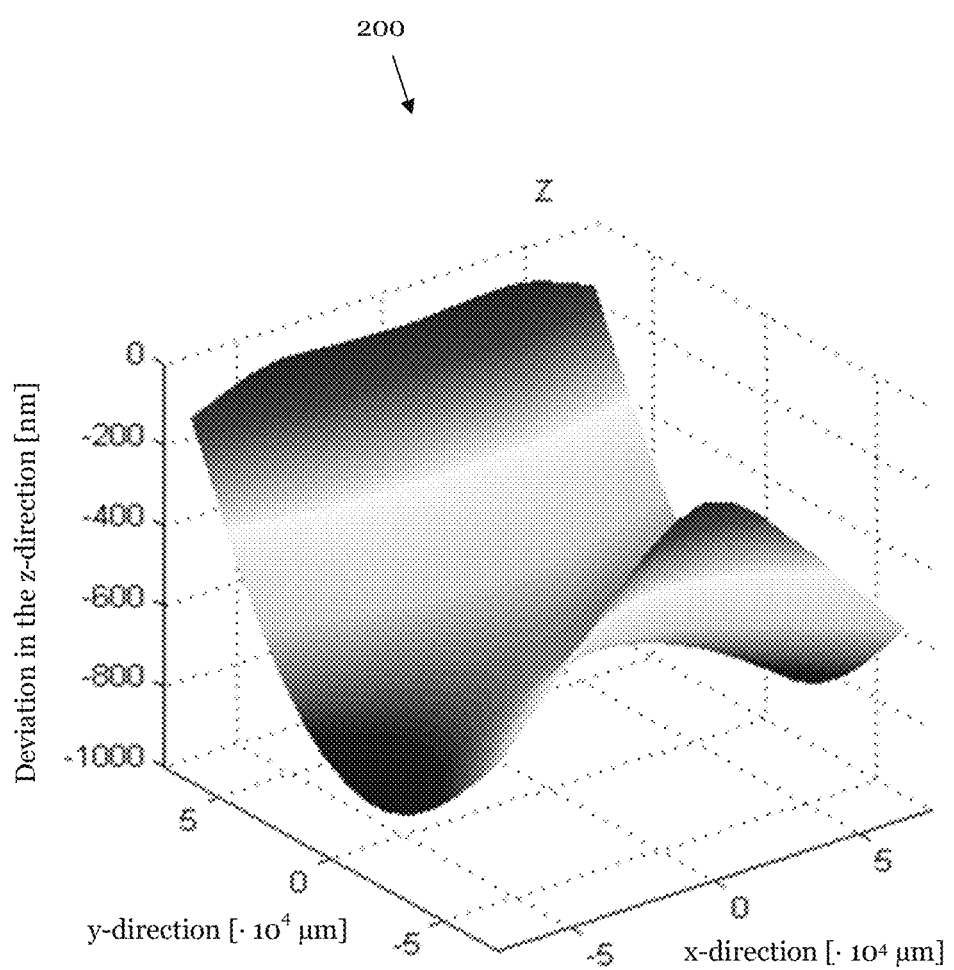
FIG. 2 presents the sagging or surface deformation of a transmissive photolithographic mask in a three-point mount.

The diagram 200 in FIG. 2 reproduces the measured sagging and the surface deformation of a transmissive mask in a three-point mount 140. In relation to the three bearing points, the transmissive mask has a sagging in the region of approximately 1 μm. The second measuring unit explained in the context of FIG. 12 can be used for measuring the height profile or the surface contour of a mask.

Figure 3:
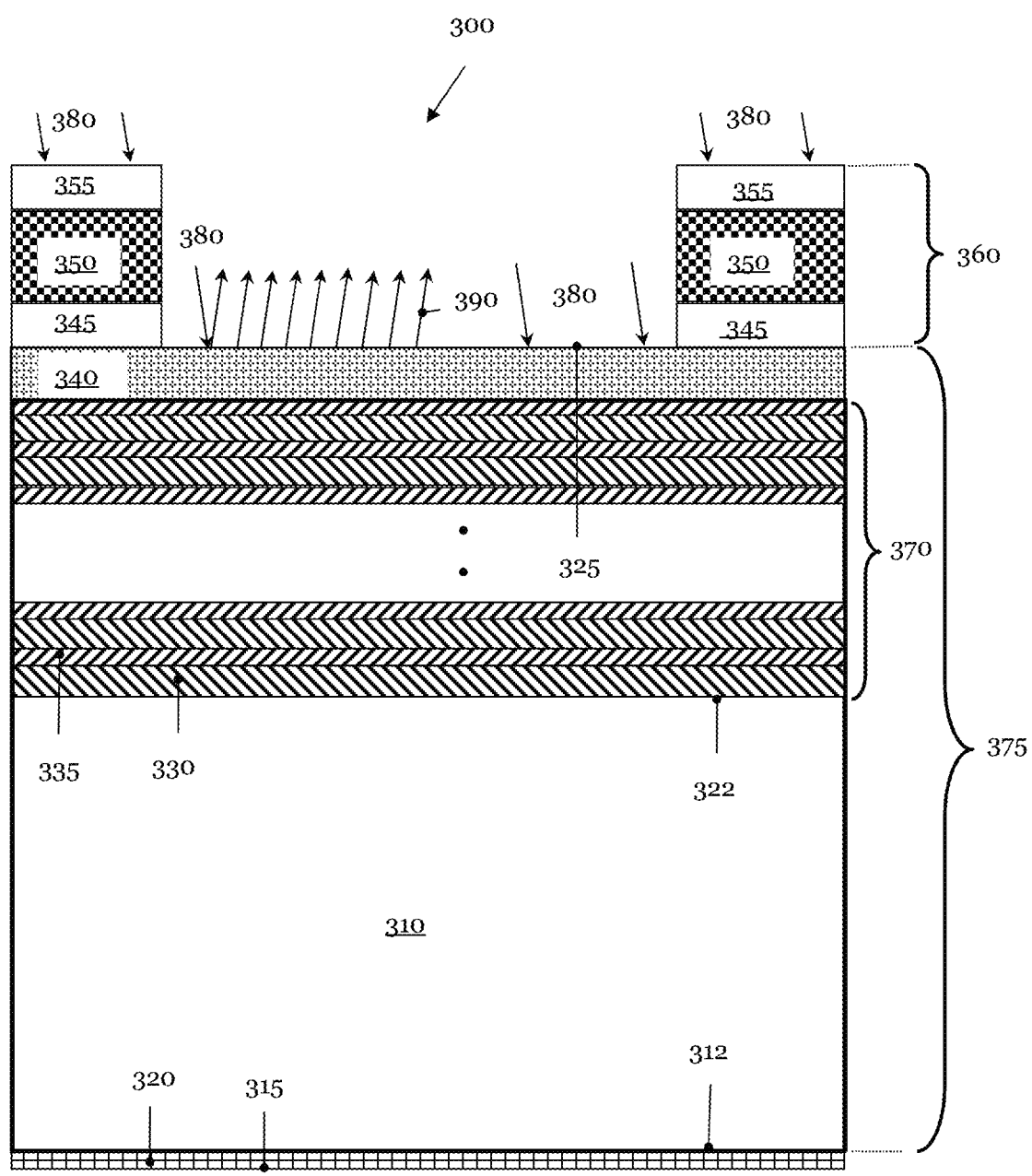
FIG. 3 schematically illustrates a cross section through an ideal reflective photolithographic mask for the extreme ultraviolet (EUV) wavelength range.

FIG. 3 schematically presents a section through an ideal absorbing reflective mask 300 for the EUV wavelength range. A reflective mask for the EUV wavelength range is also referred to below as EUV mask or EUV photomask. The exemplary ideal EUV mask 300 is designed for an exposure wavelength in the region of 13.5 nm. The EUV mask 300 has a substrate 310 made of a material with a low coefficient of thermal expansion, such as quartz, for example. Other dielectrics, glass materials or semiconducting materials can likewise be used as substrates 310 for EUV masks 300, such as ZERODUIR®, ULE® or CLEARCERAM®, for instance. The rear side 312 or the rear-side surface 315 of the substrate 310 of the EUV mask 300 serves to hold the substrate 310 during the production of the EUV mask 300 and during the operation thereof in a stepper of a lithography apparatus. Preferably, a thin electrically conductive layer 320 for holding the substrate 310 on an electrostatic chuck (ESC) is applied to the rear side 312 of the substrate 310. The chuck is not illustrated in FIG. 3.

A multilayer film or a multilayer structure 370 comprising 20 to 80 pairs of alternating molybdenum (Mo) 330 and silicon (Si) layers 335, which are also referred to as MoSi layers below, is deposited onto the front side 322 of the substrate 310. In order to protect the multilayer structure 370, a capping layer 340 made of silicon dioxide, for example, is applied on the topmost silicon layer 335. Other materials such as ruthenium (Ru), for example, can likewise be used for forming a capping layer 340. Instead of molybdenum, it is also possible to use layers composed of other elements having a high mass number, such as e.g. cobalt (Co), nickel (Ni), tungsten (W), rhenium (Re), zirconium (Zn) or iridium (Ir), for the MoSi layers. The deposition of the multilayer structure 370 can be carried out by ion beam deposition (IBD), for example.

The substrate 310, the multilayer structure 370 and the capping layer 340 are also referred to as a mask blank 375 below. However, a structure having all the layers of an EUV mask 300, but without structuring of the whole-area absorber layer 360, may also be referred to as a mask blank 375.

In order to produce an EUV mask 300 from the mask blank 375, a buffer layer 345 is deposited on the capping layer 340. Possible buffer layer materials are quartz ($SiO_2$), silicon oxygen nitride (SiON), Ru, chromium (Cr) and/or chromium nitride (CrN). An absorption layer 350 is deposited on the buffer layer 345. Materials suitable for the absorption layer 350 are, inter alia, Cr, titanium nitride (TiN) and/or tantalum nitride (TaN). An antireflection layer 355, for example made of tantalum oxynitride (TaON), can be applied on the absorption layer 350.

The absorption layer 350 is structured, with the aid of an electron beam or a laser beam, for example, such that a structure of absorbing pattern elements 350 is produced from the whole-area absorption layer 360. The buffer layer 345 serves to protect the multilayer structure 370 when structuring the absorber layer 360, i.e. when producing the pattern elements 350.

The EUV photons 380 are incident on the EUV mask 300. The incident EUV photons 380 are absorbed in the regions of the pattern elements 350 and at least the majority of the EUV photons 380 are reflected by the multilayer structure 370 in the regions which are free from absorbing pattern elements 350.

The multilayer structure 370 should be designed in such a way that the layer thicknesses of, e.g., a molybdenum layer 330 and a silicon layer 335 correspond to an optical thickness of λ2 of the actinic wavelength for the EUV photons 380 that are incident on the multilayer structure 370 at the predetermined angle of incidence. A deviation from this condition leads to a local violation of Bragg's reflection condition and hence to a change of the locally reflected light in the EUV wavelength range. On account of the very small wavelengths, the EUV range places extreme demands on the homogeneity of the individual layers of the multilayer structure 370 and on the placement of the pattern elements 350 on the multilayer structure 370.

Figure 4:
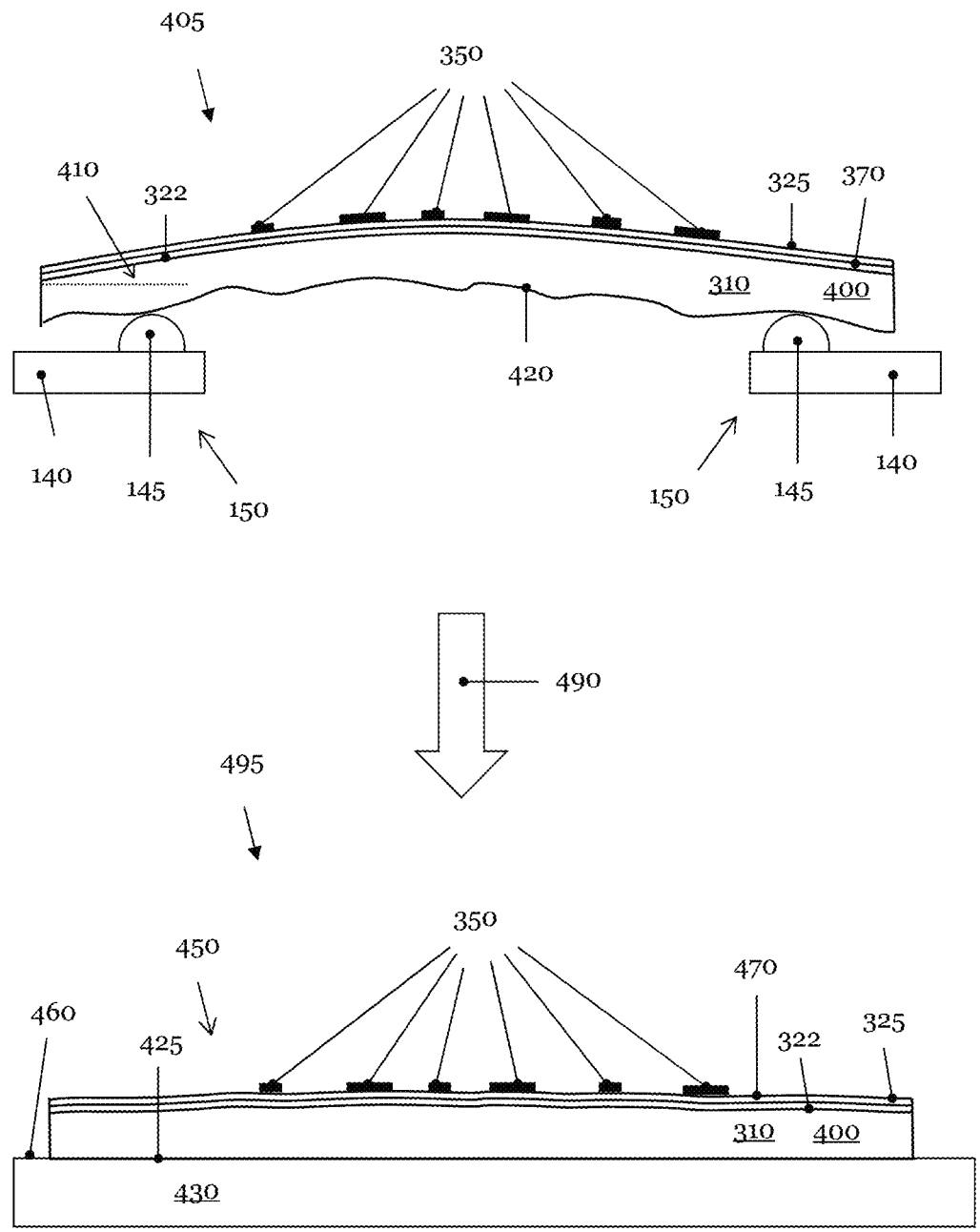
FIG. 4 presents, in the upper partial image, schematically a section through a real reflective mask fixed by use of a three-point mount and shows, in the lower partial image, the reflective mask from the upper partial image mounted on an electrostatic chuck.

FIG. 3 illustrates an ideal EUV mask 300. The EUV mask 400 in the upper partial image 405 of FIG. 4 schematically shows a section through a real EUV mask 400. The EUV mask 400 is mounted on two hemispheres 145 of a three-point mount 140. The three-point mount 140 is part of a measurement environment 150 of the EUV mask 400, in which the latter is produced and measured at least in part and which does not correspond to the operating environment of said mask. Besides the three-point mount 140, the measurement environment 150 has defined ambient conditions, for example a predefined temperature, a predefined air pressure and a predefined air humidity.

Unlike the ideal EUV mask 300 in FIG. 3, the real EUV mask 400 in the measurement environment 150 in FIG. 4 has a global curvature 410. The global mask curvature 410, bending or flexing is referred to in the art as "mask bow." The maximum height difference of the height profile is denoted by PV, standing for peak to valley, in the art. The global curvature or bending 410 of the substrate front side 325, on which the multilayer structure 370 and the pattern elements 350 are applied, has a convex shape in the example illustrated in FIG. 4. The internal stresses arise in the EUV mask 400, in particular in the substrate 310 thereof, as a result of the deposition of the multilayer structure 370 on the substrate 310 at a temperature of approximately 200° C. The different coefficients of expansion of the materials of the multilayer structure 370 and of the substrate 310 lead to the buildup of internal stresses in the combination of substrate 310 and multilayer structure 370 during the cooling process of this material combination. In a three-point mount 140, there is a combination of the curvature 410 caused by the internal stresses of the EUV mask 400 and a deformation caused by the inherent weight of the mask in the three-point mount 140. In the example illustrated in the upper partial image 405 in FIG. 4, the gravitational force counteracts the curvature produced by the internal stresses.

Depositing the absorber layer 360, structuring the pattern elements 350 and producing black borders at the boundaries of the individual exposure fields of the EUV mask 400 likewise contribute, in the EUV photomask 400, to internal stresses or the changes therein during the mask production process. Furthermore, a thin, whole-area electrically conductive rear-side layer 320 makes a contribution to the internal stresses of the photolithographic mask 400. The conductive rear-side layer 320 in FIG. 3 has been suppressed in FIG. 4 for reasons of clarity. Typically, the largest contribution to the internal stresses of an EUV mask 400 comes from the multiplicity of MoSi layers 330, 335 of the multilayer structure 370. The internal stresses of absorbing EUV masks 400 typically lie in a range of 100 MPa to 5 GPa, in particular in the range of 300 MPa to 500 MPa.

Besides a global curvature 410 of the EUV mask 400, the rear side 315 of the EUV mask 400 has unevennesses 420 relative to an average curvature 410. The unevennesses 420 of the rear-side surface 315 of the EUV mask 400 are shown greatly exaggerated in FIG. 4 for illustration reasons. The unevennesses 420 of the EUV mask 400 may originate from a rear side 312 of the substrate 310 of the EUV mask 400 that has not been polished to be perfectly planar. The unevennesses 420 of the substrate 310 can be smoothed or else amplified by the thin, rear-side electrically conductive layer 320. A local deviation of the rear-side surface 315 from the average rear-side surface can be in the double-digit nanometers range.

The placements, i.e. the positions, of the pattern elements 350 of the EUV mask 400 are measured in the measurement environment 150 in the upper partial image 405 of FIG. 4.

In the exemplary measurement environment 150 illustrated in the upper partial image 405 of FIG. 4, the gravitational force or gravitation counteracts the curvature 410 of the EUV mask 400 on account of the three-point mount 140 of the curved EUV mask 400. The measurement data determined in the measurement environment 150, for example the placement data of the pattern elements 350 and/or the abovementioned ambient conditions of the measurement environment 150, are then intended to be transformed into an operating environment 450 of the EUV mask 300.

The lower partial image 495 of FIG. 4 illustrates the EUV mask 400 from the upper partial image 405 in its operating environment 450. In the operating environment 450, the EUV mask 400 is fixed by use of an electrostatic chuck 430. The arrow 490 illustrates the transition from the measurement environment 150 of the EUV mask 400 into the operating environment 450 thereof. It is assumed below that the surface 460 of the electrostatic chuck 430 is substantially planar. It is furthermore assumed below that the ESC 430 exerts on the EUV mask 400 a force which is sufficient to deform the rear side 315 of said mask such that said rear side bears on the surface 460 of the ESC 430 substantially over the whole area. Under these prerequisites, the ESC 430 substantially cancels the global curvature 410 of the EUV mask 400. Furthermore, the electrostatic attraction of the ESC 430 substantially compensates for the unevennesses 420 of the rear side 315 of the EUV mask 400.

However, under the force influence of the ESC 430, the rear-side unevennesses 420 of the EUV masks 400 propagate at least partly through the mask 400 and appear as unevennesses 470 on the front side 325 of the EUV mask 400. However, local unevennesses 470 of the front side 325 of the EUV mask 400 lead to a local change in the positions of the pattern elements 350 of the EUV mask 400. The present application addresses the problem, then, of taking account of the changes in the positions of the pattern elements 450, said changes being caused by local unevennesses 420 of the rear side 315 of an EUV mask 400, when determining the placements of the pattern elements 350 of the EUV mask 400 in the operating environment 450 thereof.

Some of the background issues appertaining to the above-described problem area of the production and measurement of an EUV mask 400 in a measurement environment 150, in which the EUV mask 400 is fixed in a three-point mount 140, and the operation of the EUV mask 400 in an operating environment 450, in which said mask is electrostatically chucked, i.e. is held by an electrostatic chuck 430, will be discussed below with reference to FIGS. 5 to 8.

Figure 5:
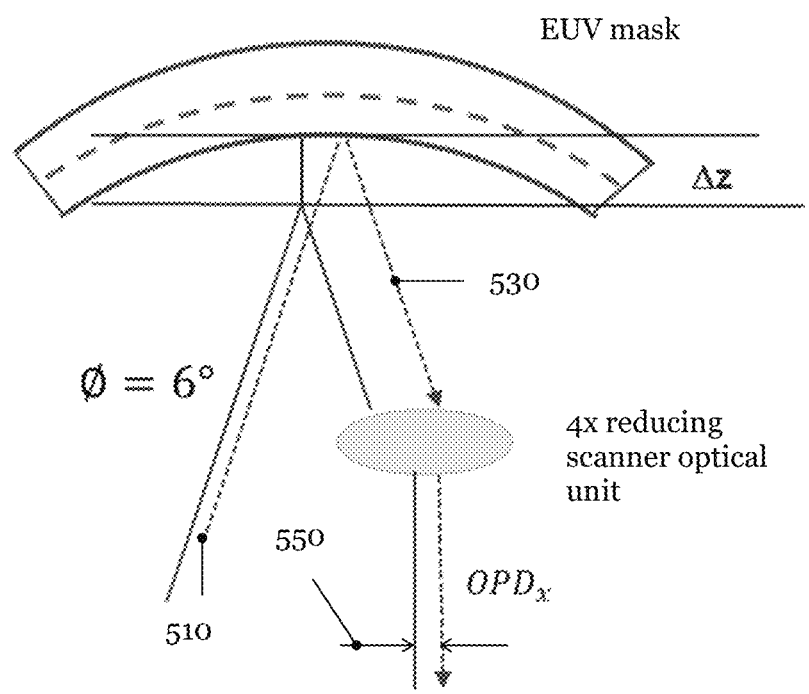
FIG. 5 from the prior art schematically elucidates an out-of-plane distortion (OPD) of the curved EUV mask from the upper partial image of FIG. 4.

FIG. 5 schematically elucidates a first effect of a curved mask surface 325, which results in a beam offset of reflected EUV radiation 550. The beam offset 550 is caused by non-perpendicular incidence of the actinic radiation on the front side 325 of the EUV mask 400 in combination with a height variation of the curved EUV mask 400. The beam offset brings about a displacement of the measured pattern elements 350 to positions which are different from positions of the pattern elements 350 of a non-curved EUV mask 400, which is illustrated in the lower partial image 495 of FIG. 4. The beam offset 550 in the x-direction, i.e., in one direction in the mask plane, as a result of the global curvature 410 of the EUV mask 400 is referred to as the out-of-plane distortion (OPD) in the art. The OPD is captured by the following formula:

$$OPD_x = \Delta z \cdot \tan \Phi \cdot M \quad (1)$$

Typically, the EUV light 510 in an EUV scanner is incident on the surface 325 of an EUV mask 400 at an angle of 5° to 9° relative to the normal to the EUV mask 400. In the example illustrated in FIG. 5, an angle of $\Phi=6°$ was selected. The EUV mask in FIG. 5 has a height change $\Delta z$ over the area of the EUV mask on account of its global curvature 410. The projection optical unit of the scanner for the EUV wavelength range often has a magnification in a range of ¼ to ⅛. In the example in FIG. 5, the projection optical unit of the scanner reduces the pattern elements 350 of the EUV mask by a factor of 4.

Figure 6:
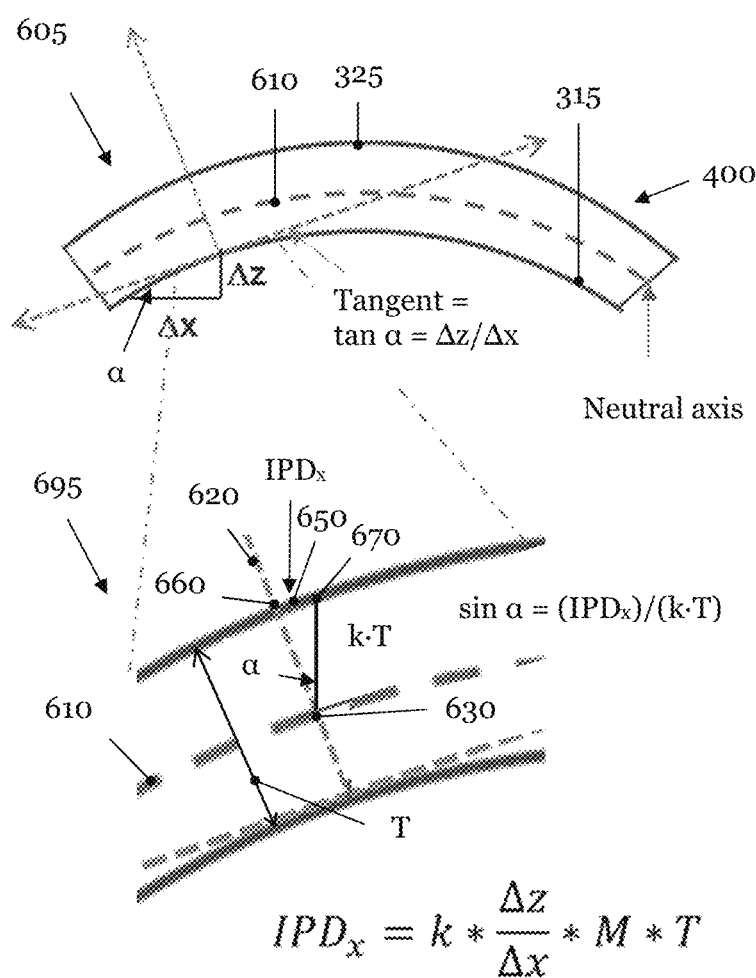
FIG. 6 from the prior art schematically defines an in-plane distortion (IPD) of the curved EUV mask from the upper partial image of FIG. 4.
Figure 7:
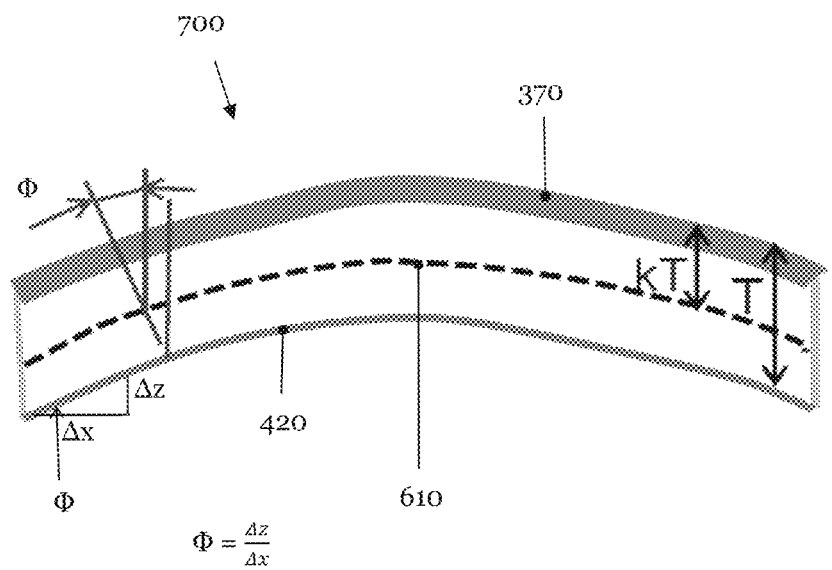
FIG. 7 from the prior art reproduces the EUV mask from the upper partial image of FIG. 4, in which some variables characterizing a curvature of the mask are additionally indicated.

A second effect of a locally curved mask surface 325 on the measured placement of the pattern elements 350 is elucidated schematically with reference to FIG. 6. The upper partial image 605 of FIG. 6 schematically presents the curved EUV mask from FIG. 5. The local curvature of the surface of an EUV mask is described by the tangent $\Delta z/\Delta x$. The tangent may likewise be expressed by the angle $\alpha$ according to the equation $\tan \alpha = \Delta z/\Delta x$.

The dashed line 610 in the curved EUV mask illustrates the neutral axis 610 of the EUV mask in both partial images 605 and 695 of FIG. 6. The neutral axis 610 describes that area in a body along which—in the event of the body being subjected to loading—a compressive stress transitions into a tensile stress. In the EUV mask in FIG. 6, the part above the dashed line 610 is under tensile stress and the part below the dashed line is subject to a compressive stress. The EUV mask is free of internal strains in the two-dimensional plane of the neutral axis 610.

The lower partial image 695 of FIG. 6 shows an enlarged excerpt from the curved EUV mask from the upper partial image 605 of FIG. 6. The relationship between a change in the position of the neutral axis 610 and the displacement of a pattern element 350 on the surface 325, caused by a curvature of the EUV mask 400, is elucidated with reference to the partial image 695. The dashed line of intersection 620 through the EUV mask intersects the neutral axis 610 perpendicularly and thus substantially also intersects the front-side surface 325 and the rear-side surface 315 at a right angle. The perpendicular of the point of intersection 630 of the neutral axis 610 to the front-side surface 325 of the EUV mask has a length $k \cdot T$. Here, T describes the thickness of an EUV mask. The substrate of an EUV mask typically has—as explained above—a thickness of 6.35 mm. The parameter k defines the position of the neutral axis 610 as a fraction of the mask thickness T. For an EUV mask without internal strains, for instance the ideal EUV mask 300 from FIG. 3, k has the value 0.5. For a strained EUV mask 400, the parameter k according to the definition specified in the lower partial image of FIG. 6 typically lies in an interval of ½<k<⅔.

The displacement of the pattern elements 350 on the front-side surface 325 of the EUV mask 400 or the IPD (in-plane distortion) in the x-direction is determined by the distance 650 between the point of intersection 660 of the line of intersection 620 and the point of intersection 670 of the perpendicular $k \cdot T$ to the point of intersection 630 with the surface 325. The distance 650 thus determines a displacement of the pattern elements 350 on account of a local curvature of the EUV mask 400. This yields the following for the $IPD_x$ relative to the wafer:

$$IPD_x = k \cdot T \cdot \frac{\Delta z}{\Delta x} \cdot M \quad (2)$$

Here M denotes the magnification factor of the projection optical unit of the EUV scanner. The direction and the magnitude of the displacement 650 of the pattern elements 350 of the EUV mask 400 on account of a curvature of the EUV mask 400 is proportional to the local curvature $$\frac{\Delta z}{\Delta x},$$

the thickness of the EUV mask T and the change in position of the neutral axis 610 described by the parameter k and scales with the magnification or reduction of the projection mirror of an EUV stepper.

FIG. 7 once again reproduces the curved EUV mask 400 from the upper partial image 405 of FIG. 4. The pattern elements 350 of the mask 400 have been suppressed in FIG. 7 for reasons of clarity. Furthermore, the diagram 700 shows some of the variables introduced during the discussion of FIGS. 5 and 6. The dashed curve 610 denotes, as in FIG. 6, the neutral axis 610 of the EUV mask 400. The letter T describes the thickness of the EUV mask 400. To put it more precisely, T identifies an average thickness of the EUV mask 400. The variable k·T characterizes the position of the neutral axis 610 of the EUV mask 400. The angle $$\phi = \frac{\Delta z}{\Delta x}$$

describes the local curvature. For EUV masks, the global curvature 410 is typically determined by a second-order polynomial fit to a measured height profile:

$$Z_{Fit}=a+b\cdot x+c\cdot y+d\cdot x\cdot y+e\cdot x^2+f\cdot y^2. \quad (3)$$

Figure 8:
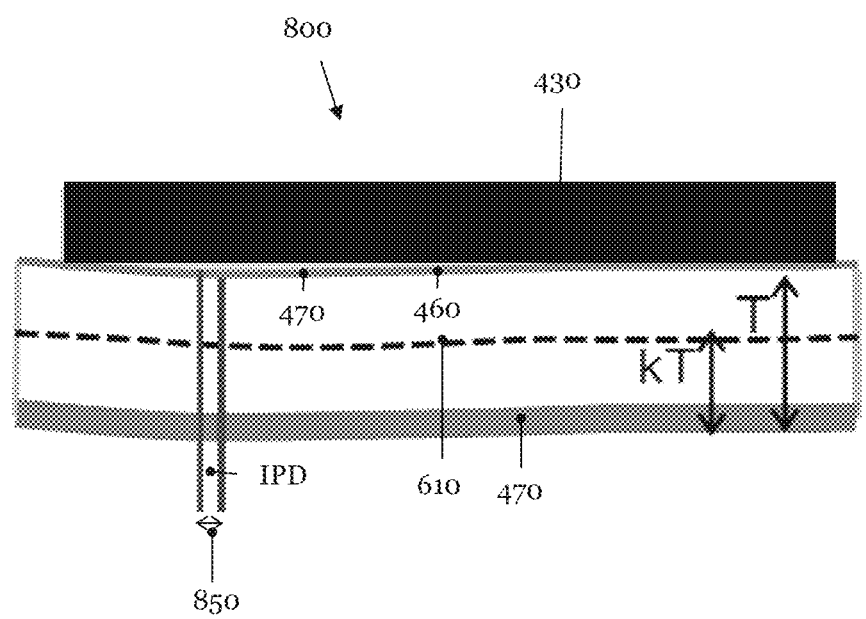
FIG. 8 from the prior art reproduces the EUV mask from FIG. 7, said mask being held by an electrostatic chuck.

The diagram 800 in FIG. 8 schematically reproduces the lower partial image 495 from FIG. 4, in which the EUV mask 400 is held in a predefined position by an electrostatic chuck 430. The global curvature 410 of the EUV mask 400, which is described by equation (3), is substantially removed by the EUV mask 400 being clamped onto the electrostatic chuck 430. The pattern elements 350 are displaced as a result. The IPD error results from the displacement of the pattern elements 350 and the residual local slope, which results from the flatness of the rear side 315 of the mask and the front side 325 of the mask:

A local slope can be defined as follows:

$$\text{local slope}_{front} = \frac{\Delta z_{front}}{\Delta x}, \text{local slope}_{back} = \frac{\Delta z_{back}}{\Delta x}, \quad (4)$$

where Δx denotes the spacing of the grid points of the second-order fit in equation (3). The local slope is normally indicated in μrad. Alternatively, it is also possible to define the surface unevennesses by the local slopes multiplied by the grid spacing chosen.

As a result of the electrostatic attraction of the ESC 430, the rear side 315 of the EUV mask 400 is deformed, with the result that the latter bears on the surface 460 of the electrostatic chuck 430 substantially over the whole area. The unevennesses 420 of the rear side 315 of the EUV mask 400 are transferred at least in part to the front side 325 of the EUV mask 400 by the stiff structures of the substrate 310 and the multilayer structure 370. The resultant additional unevenness 470 of the front side 325 of the EUV mask 400 leads to a displacement of the pattern elements 350 on the front side 325 of the EUV mask 400. The total displacement 850 of the pattern elements 350 is also called the image placement error (IPE). The image placement error is described as follows:

$$\text{IPE}_{IPD}=k\cdot T\cdot \phi \cdot M \quad (5)$$

where the variables have their meanings introduced above and φ denotes the local slope of the rear side of the mask (local slope$_{back}$) 315.

Figure 9:
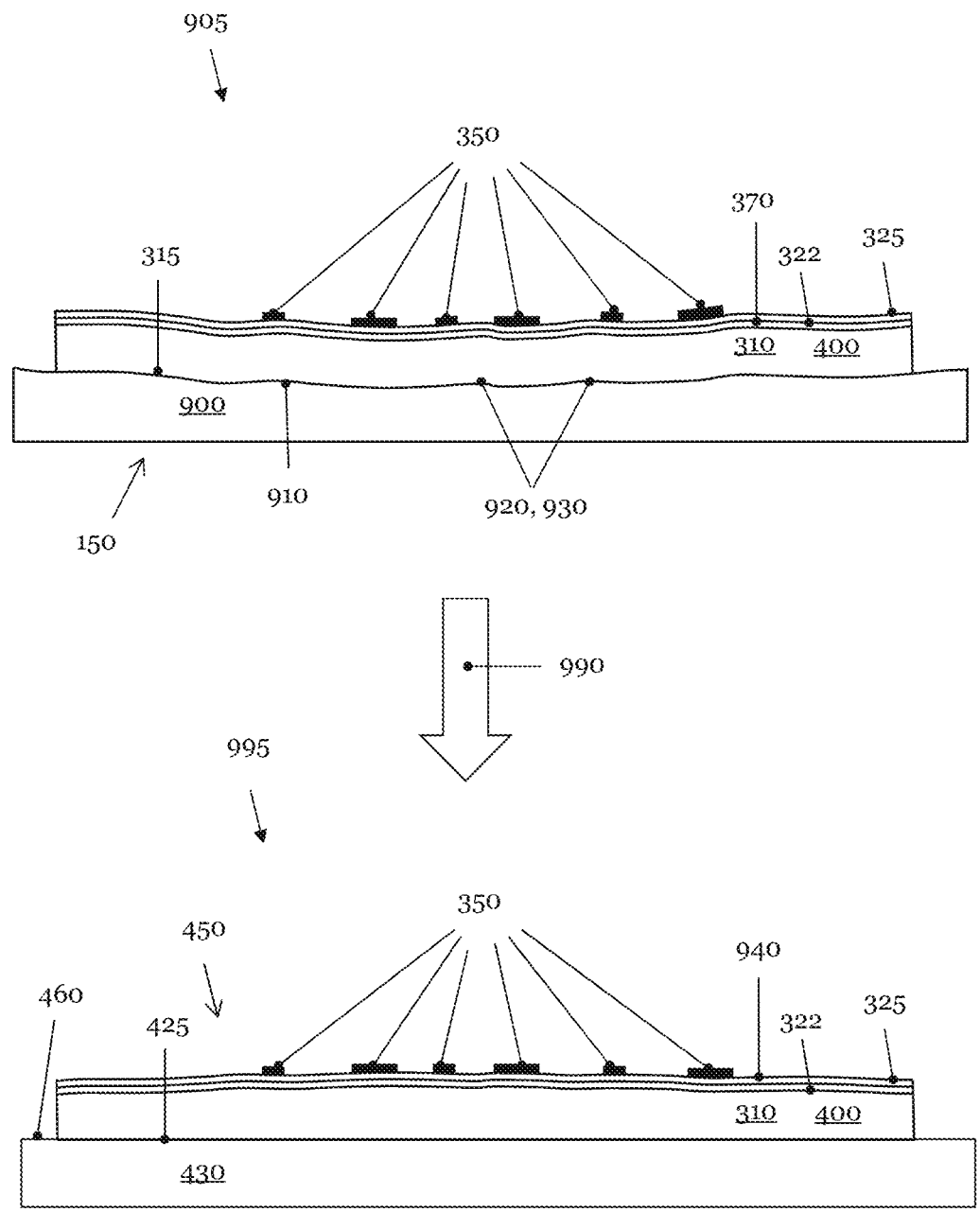
FIG. 9 shows, in the upper partial image, schematically a section through a reflective photomask held by a chuck whose surface has unevennesses, and reproduces, in the lower partial image, the fixing by an electrostatic chuck whose surface is assumed to be ideally flat.

The upper partial image 905 of FIG. 9 presents a schematic section through a mount 900 for fixing the reflective photomask 400 in a second embodiment in the measurement environment 150. In the exemplary embodiment in FIG. 9, the mount 900 is embodied in the form of a chuck 900. The chuck 900 can be embodied in the form of a vacuum chuck (VC) or as an electrostatic chuck (ESC). The surface 910 of the mount 900 configured for holding or fixing a reflective mask 400 has unevennesses 920, which are shown greatly exaggerated in FIG. 9 for illustration reasons. The unevennesses 920 of the surface 910 of the chuck 900 can be determined as surface unevenness data 930 by use of a measuring unit. This measurement process is explained below in the context of FIG. 15.

The unevennesses 920 of the surface 910 of the chuck 900 may originate from the polishing process of the surface 910 of the chuck 900. Polishing processes can produce surfaces having residual unevennesses in the double-digit nanometers range. Thermal stresses of the chuck 900 can likewise contribute to unevennesses 920 of the surface 910.

The reflective photolithographic mask 400 is fixed on the surface 910 of the mount 900 in the measurement environment 150. The surface unevennesses 420 of the rear side 315 of the reflective mask 400 are concealed or eliminated by the unevennesses 920 of the surface 910 of the mount 900. This likewise applies to internal stresses of the reflective mask 400, as explained in the context of FIG. 8.

The placements, i.e. the positions, of the pattern elements 350 of the EUV mask 400 are measured in the measurement environment 150 in the upper partial image 905 of FIG. 9. The front-side 325 unevennesses 940 of the fixed mask 400 can likewise be measured in the exemplary measurement environment 150 illustrated in the upper partial image 905 of FIG. 4. The measurement data determined in the measurement environment 150, for example the placement data of the pattern elements 350, the measured unevennesses 940 of the front side 325 of the mask 400, and/or the abovementioned ambient conditions of the measurement environment 150, are then intended to be transformed into an operating environment 450 of the EUV mask 400. The transformation process is illustrated by the arrow 990 in FIG. 9. The deformation of the mask 400 by the mount lies in the linear deformation range of the mask 400. Therefore, after being lifted off the mount 900, the reflective mask 400 substantially assumes its original shape again.

The lower partial image 995 of FIG. 9 illustrates the EUV mask 400 from the upper partial image 905 in the operating environment 450 thereof. The EUV mask 400 is fixed by use of an electrostatic chuck 430 in the operating environment 450. In contrast to the mount 900, it is assumed then—as already explained in the discussion of FIG. 4—that the surface 460 of the electrostatic chuck 430 is substantially planar. It is furthermore assumed below that the ESC 430 exerts on the EUV mask 400 a force which is sufficient to deform the rear side 315 of the reflective mask 400, such that said rear side bears on the surface 460 of the ESC 430 substantially over the whole area. Under these prerequisites, the ESC 430 substantially compensates for the rear-side unevennesses as well as a global curvature 410 of the EUV mask 400.

As already explained in the context of FIG. 4, however, under the force influence of the ESC 430, the rear-side unevennesses 420 of the EUV masks 400 propagate at least in attenuated form through the mask 400 and appear as unevennesses 940 on the front side 325 of the EUV mask 400. Local unevennesses 940 of the front side 325 of the EUV mask 400 lead to a local change in the positions of the pattern elements 350 of the EUV mask 400. The present application takes account of the changes in the positions of the pattern elements 450, said changes being caused by local unevennesses 920 of the surface 910 of the mount 900 of the EUV mask 400, when determining the placements of the pattern elements 350 of the EUV mask 400 in the operating environment 450.

An explanation will now be given below of various embodiments of a device which make it possible to take account of the rear-side unevennesses 420 of the EUV mask 400 when determining the placements of the pattern elements 350 of the EUV mask 400 in the operating environment 450 thereof.

Figure 10:
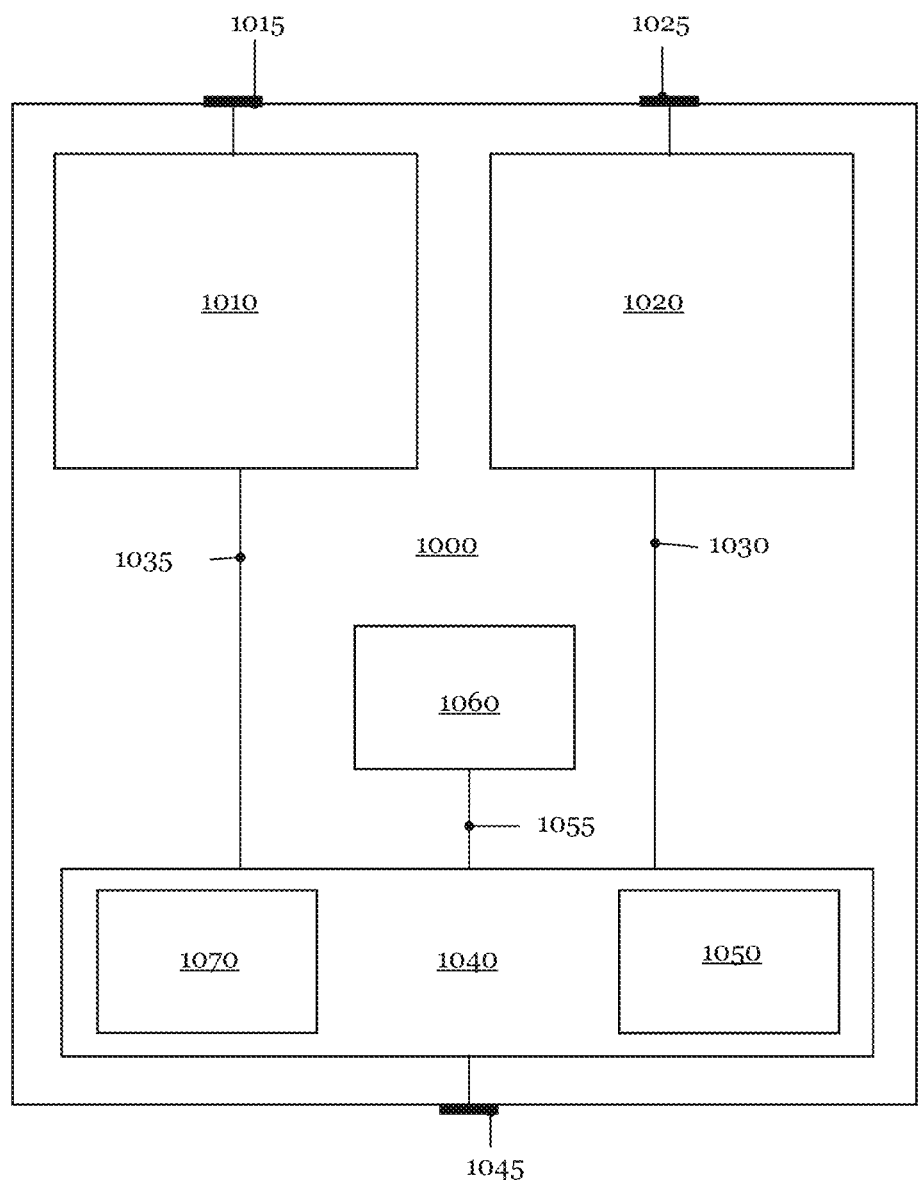
FIG. 10 presents a schematic section through some components of a device for determining placements of pattern elements of a photolithographic mask.

FIG. 10 schematically shows a section through some components of a device 1000 for determining the placements of the pattern elements 350 of the reflective photolithographic mask 400 in the operating environment 450 thereof. The device 1000 comprises a first means 1010, which can determine surface unevenness data 420 of a rear side 315 of the EUV mask 400 and/or surface unevenness data 920 of a mount 900 of the reflective photolithographic mask 400.

In a first simple embodiment, the first means 1010 has an interface 1015. The interface 1015 can be wireless or wired. Via the interface 1015, the first means 1010 obtains data from an external first measuring device and/or an external third measuring device, which are not illustrated in FIG. 10. The data include measurement data or data derived from the measurement data appertaining to the unevennesses 420 of the rear side 315 of the EUV mask 400 and/or data appertaining to the unevennesses of a mount 900 of a reflective mask 400 in a measurement environment 150. The first means 1010 forwards the data being obtained, if appropriate after corresponding processing, via the connection 1025 to the evaluation unit 1040 of the device 1000.

Furthermore, the device 1000 has a second means 1020, which can determine placement data of the pattern elements 350 of the EUV mask 400, wherein the EUV mask 400 is fixed on a three-point mount 140. The three-point mount 140 corresponds to a measurement environment 150 of the EUV mask 400 and said measurement environment is not identical to the operating environment 450, in which the EUV mask 400 is held by an ESC 430. Furthermore, the second means 1020 can determine unevennesses data of the front side 325 of a reflective mask 400, wherein the reflective mask 400 can be held on a three-point mount 140 or can be fixed by a chuck 900.

In a first embodiment, the second means 1020 has an interface 1025. In a manner similar to the interface 1015, the interface 1025 can also be wireless or wired. Via the interface 1025, the second means 1020 can obtain placement data of the pattern elements 350 that were measured by the first measuring unit or a second external measuring device, which is not shown in FIG. 10. In addition, the second means 1020 of the device 1000 can obtain data about the unevennesses 940 of the front side 325 of the reflective mask 400 that are obtained from a fourth or the second external measuring device, which are not shown in FIG. 10. The obtained placement data and/or the surface unevenness data 940 of the front side 315 of the mask 400 can be recorded in the measurement environment 150 and/or the operating environment 450 of the EUV mask 400. The second means 1020 forwards the placement data being obtained, if appropriate after corresponding processing, via the connection 1030 to the computing unit 1040 of the device 1000.

The computing unit 1040 comprises a non-volatile memory 1050. Models for various types of EUV masks 400 can be stored in the non-volatile memory 1050. The models can describe the curvature 410 for various types of EUV mask. Furthermore, the models can simulate the transfer of rear-side unevennesses of various types of EUV mask into changes in position of the pattern elements 350 of an EUV mask 400 in the operating environment 450 thereof.

The computing unit 1040 can contain algorithms that calculate the placements of the pattern elements 350 of the reflective mask 400 in the operating environment 450 thereof from the surface unevenness data of the rear side and/or of the front side and placement data obtained via the connections 1025 and 1030. The computing unit 1040 can include a dedicated hardware component 1070 designed specifically for carrying out specific parts or substantially all parts of the calculation of the placements of the pattern elements 350 of the EUV mask 400. The hardware component 1070 can comprise an ASIC (application specific integrated circuit).

The computing unit 1040 of the device 1000 can convert the placement data of the pattern elements 350 and the surface unevenness data 420, 940 of the rear side 315 and/or of the front side 325 of the EUV mask 400 into a common coordinate system. In addition to the placement data of the pattern elements 350 and the surface unevenness data 420, 940 of the rear side 315 and/or of the front side 325, the computing unit 1040 can obtain parameters that characterize the ambient conditions of the measurement environment 150.

The computing unit 1040 can have an interface 1045, via which the computing unit 1040 can receive and transmit data. By way of example, the computing unit 1040 can obtain data about the surface or the surface flatness of an electrostatic chuck 430. The surface of an ESC 430 is typically assumed to be perfectly planar. However, it is also possible for the computing unit 1040 to receive data regarding the flatness of the surface of the electrostatic chuck 430 via the interface 1045 and to take account of said data in the calculation of the placements of the pattern elements 350 in the operating environment 450 of the EUV mask 400.

The device 1000 can furthermore include a screen 1060, which receives data from the computing unit 1040 via the connection 1055. The calculated placements of the pattern elements 350 can be displayed on the screen 1060. Furthermore, the raw data, i.e. the surface unevenness data 420 and the placement data, can also be represented on the screen 1060. In addition, further data, for instance further parameters characterizing the measurement environment 150 and/ or the operating environment 450, can be displayed on the screen 1060.

Figure 11:
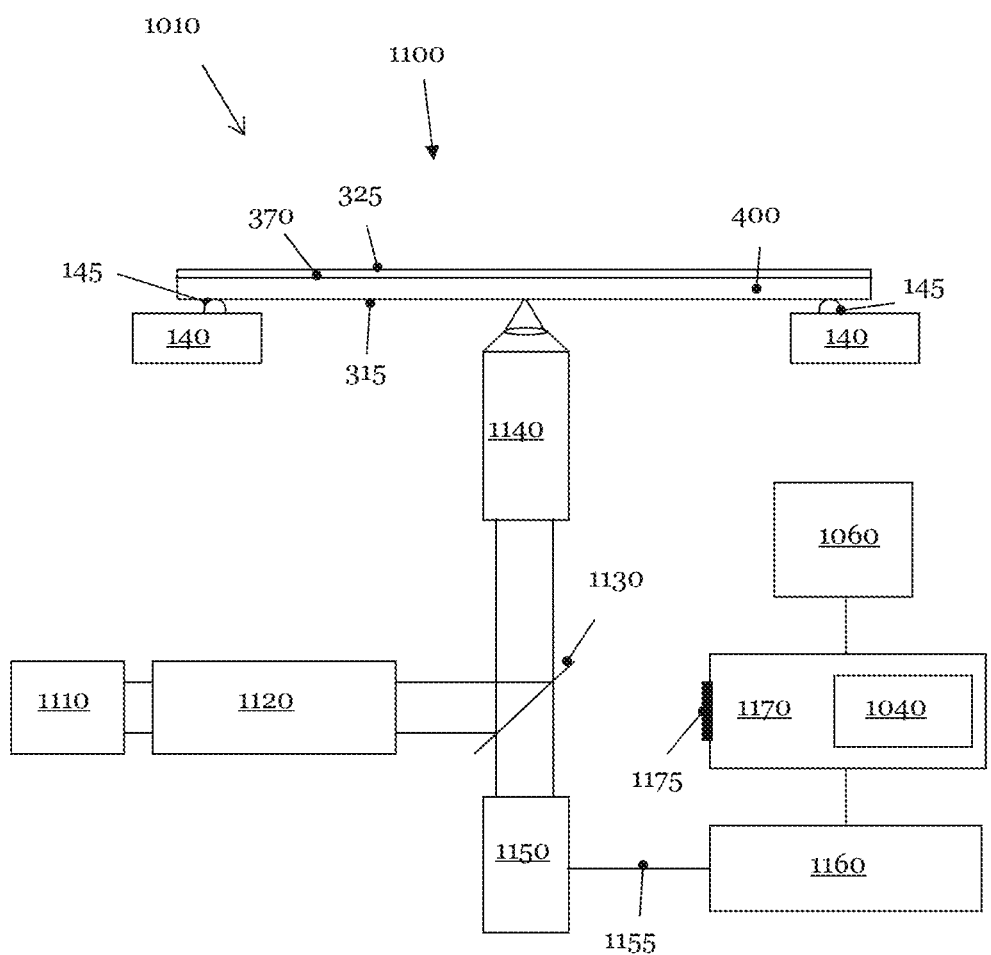
FIG. 11 reproduces a schematic section through a first measuring unit for measuring the rear-side unevennesses of a photolithographic mask, in particular of an EUV mask.

FIG. 11 schematically shows a second exemplary embodiment of the first means 1010. In order to determine the unevennesses 420 of the rear side 315 of the EUV mask 400, the latter is fixed on a three-point mount 140. The latter rests on a high-precision object stage, which is suppressed in FIG. 11. The object state is movable in three translation directions and three rotation directions. Furthermore, the movement of the object stage in all six degrees of freedom is actively monitored and regulated. In the first measuring unit 1100 in FIG. 11, the object stage is the only movable component. However, it is also possible to share the movement between the object stage and the objective 1140 of the first measuring unit 1100.

The front side 325 of the EUV mask 400 faces upwards in FIG. 11. The rear side 315 of said mask can have a conductive coating 320 for the measurement described below. However, the measurement can also be carried out without the conductive coating 320. The first measuring unit 1100 can be used for determining the unevennesses 420 of the rear side 315 of the EUV mask 400.

The first measuring unit 1100 comprises a light source 1110. The measuring unit 1100 uses, e.g., a laser system as light source 1110. The laser system can comprise a laser that emits in the deep ultraviolet (DUV) wavelength range. The laser system can comprise an ArF (argon fluoride) laser that emits electromagnetic radiation at a wavelength of approximately 193 nm. However, the laser system can also include a laser that emits light in the visible part of the electromagnetic spectrum. However, the light source 1110 can also be an EUV light source (not shown in FIG. 11).

The light from the light source 1110 passes through a focus system, which is embodied as an autofocus system 1120 in the exemplary device 1100 in FIG. 11, said system being designed to focus the light from the light source 1110 onto the rear side 315 of the EUV mask 400. A partly transmissive deflection mirror 1130 directs the light from the light source 1110 onto the objective 1140. The latter focuses the light beam from the light source 1110 onto the rear side 315 of the EUV mask 400. During normal operation, the imaging objective 1140 has a numerical aperture (NA) of 0.1 to 0.2 if the light source 1110 uses electromagnetic radiation in the visible wavelength range. If the light source 1110 uses light in the DUV wavelength range, the imaging objective preferably has an NA in the range of 0.5 to 0.9. If necessary, the resolving power of the measuring unit 1100 can be increased by increasing the NA of the objective 1140. The focusing of visible or DUV light makes it possible to produce a small spot diameter of the light on the rear side 315 of the EUV mask 400. This makes it possible to scan the rear-side unevennesses 420 of the EUV mask 400 with a high lateral spatial resolution.

Part of the light reflected from the rear side 315 of the EUV mask 300 passes through an optical unit comprising at least the objective 1140 and the partly transmissive deflection mirror 1130 and impinges on the detector 1150. By way of example, a CCD (charge-coupled device) camera can be used as detector 1150. The detector 1150 communicates the measurement data via the connection 1155 to a signal processing unit 1160, which generates an image from the measurement data of the detector 1150. The signal processing unit 1160 additionally forwards the measurement data of the detector 1150 to a computer system 1170. The computer system 1170 can contain the computing unit 1040 from FIG. 10. However, it is also possible for the computer system 1170 to transmit the measurement data of the detector 1150 via the interface 1175 to the computing unit 1040 of the device 1000 for further processing.

The device 1100 can include a scanning unit, which, as a result of the displacement of the object stage carrying the three-point mount 140 in the mask plane, i.e. in the xy-plane, enables scanning of the rear-side surface 315 of the EUV mask 400 over the active region of the EUV mask 400. The scanning unit is not reproduced in FIG. 11. In an alternative embodiment, the scanning unit can scan the objective 1140 over the rear-side surface 315 of the EUV mask 400. A combined movement of the object stage or of the three-point mount 140 and of the objective 1140 is likewise possible.

In FIG. 11, the first measuring unit 1100 measures the rear-side unevennesses 420 of an EUV mask 400. However, it is also possible to use the first measuring unit 1100 for examining the rear side of all kinds of conventional transmissive photomasks 100. Furthermore, the first measuring unit 1100 can determine the front-side unevennesses of the EUV mask 400. For this purpose, the mask 400 is turned over on the three-point mount, such that its front side 315 faces in the direction of the objective 1140. This means that the first measuring unit 1100 can also be used as a fourth measuring unit, namely a measuring unit that determines the front-side 325 unevennesses of a reflective mask 400.

Figure 12:
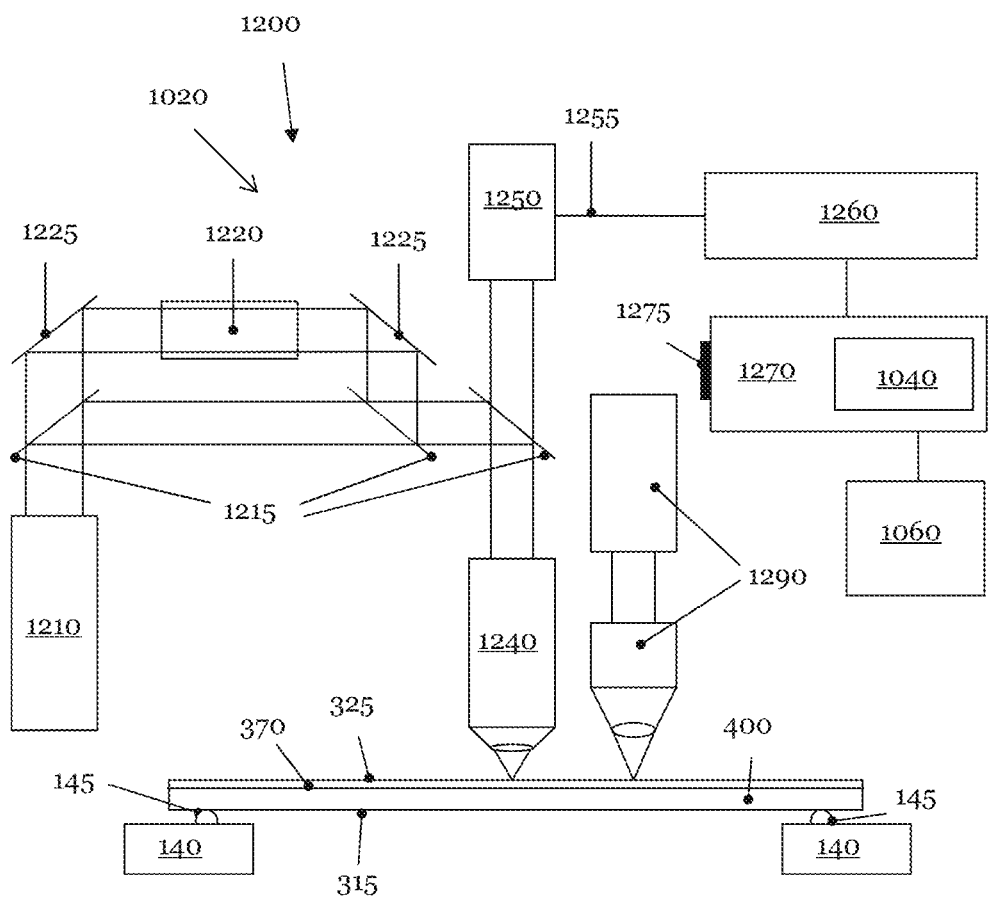
FIG. 12 illustrates a schematic section through a second measuring unit for measuring the placements of pattern elements of a photolithographic mask, in particular of an EUV mask.

FIG. 12 schematically indicates a second exemplary embodiment of the second means 1020. FIG. 12 shows a section through a functional diagram of a second measuring unit 1200, which can be used to measure the positions of the pattern elements 350 on the EUV mask 400 in the measurement environment 150. In a manner similar to that in FIG. 11, the reflective mask 400 in the measurement environment 150 is mounted on three hemispheres 145 of a three-point mount 140 on a high-precision object stage. Analogously to FIG. 11, the bending or curvature of the EUV mask 400 is suppressed in FIG. 12 for reasons of clarity. The object stage, which is not reproduced in FIG. 12, is movable in three translation directions and three rotation directions. In addition, the movement of the object stage in all six degrees of freedom is actively monitored and regulated. In the second measuring unit 1200 in FIG. 12, the object stage is once again the only movable component.

The second measuring unit 1200 uses, e.g., an excimer laser as a light source 1210, said laser emitting light in the DUV wavelength range at approximately 193 nm. The imaging objective 1240 has, as a standard, a numerical aperture (NA) which typically lies between 0.5 and 0.9. The NA of the objective 1240 can be expanded in order to increase the resolving power of the measuring unit 1200.

For example, a CCD (charge-coupled device) camera is used as a detector 1250, said detector measuring light that is reflected by the EUV mask 400. The detector 1250 transmits its measurement data via the connection 1255 to the signal processing unit 1260, which generates an image from the measurement data of the detector 1250. The image generated by the signal processing unit 1260 can be displayed on the screen 1060 of the computer system 1270 and/or the device 1000. Furthermore, the signal processing unit 1260 transmits the measurement data of the detector 1250, which include placement data of the pattern elements 350 of the EUV mask 400, to the computing unit 1040. The computing unit 1040 can be part of the computer system 1270 or part of the device 1000.

As discussed in the context of FIG. 1, conventional photomasks 100 already exhibit sagging ("mask sagging") under a three-point mount 140. EUV masks 400 additionally have a curvature 410 on account of internal stress. Therefore, the second measuring unit 1200 has a focus system, which, in the exemplary embodiment in FIG. 12, is designed as an autofocus (AF) system 1220, which is not shown in FIG. 12. The AF system 1220 assists the process of measuring the placement data of the pattern elements 350 of the EUV mask 400. In particular, the AF system 1220 can be used to produce a height profile of the EUV mask 400. With the aid of the AF system 1220, the measuring unit 1200 can measure the height profile of the EUV mask 400 while recording the positions of the pattern elements 350. If these measurement data are insufficient, the measuring unit 1200 can ascertain the height profile of the EUV mask 400 by use of the AF system 1220 in a separate measurement. This measurement can be carried out by the second measuring unit 1200 during a temperature-regulating interval of the EUV mask 400 in the measurement environment 150 (soaking time), with the result that the measurement of the height profile of the EUV mask 400 substantially does not reduce the throughput or the mask throughput of the second measuring unit 1200. Furthermore, the second measuring unit 1200 can determine surface unevenness data 470 of the front side 315 of the reflective mask 400. The second measuring unit 1200 can thus be used as a fourth measuring unit.

The mirrors 1225 and the partly transmissive mirrors 1215 direct the laser beam from the light source 1210 onto the objective 1240.

The measuring unit 1200 furthermore comprises an optical auxiliary system 1290 for roughly aligning the pattern elements 350 of the EUV mask 400. Furthermore, the measuring unit 1200 can comprise further auxiliary systems (not illustrated in FIG. 12), which measure the ambient conditions prevailing in the vicinity of the EUV mask 400. An auxiliary system that measures the ambient conditions can comprise an interferometer, in particular a laser interferometer. Measured parameters can comprise, for example: the temperature, the air pressure and the air humidity. The measured parameters are likewise transmitted to the computing unit 1040.

The computer system 1270 can display the image calculated by the signal processing unit 1260 on the screen 1260 of the computer system 1270. In a manner similar to that for the first measuring unit 1100 in FIG. 11, the computer system 1270 can control the light source 1210, the movements of the object stage, the objective 1240 and/or the AF system 1220. Furthermore, the computer system 1270 can comprise the computing unit 1040.

In the example illustrated in FIG. 12, the computing unit 1040 is part of the computer system 1270. In an alternative embodiment, the computing unit 1040 can be embodied as an independent unit which can exchange data or measurement data with the signal processing unit 1260 and/or the computer system 1270 via a data connection.

It goes without saying that, besides reflective masks 400, the second measuring device 1200 can also measure the pattern elements 120, 130 of the various types of conventional transmissive photomasks 100.

Figure 13:
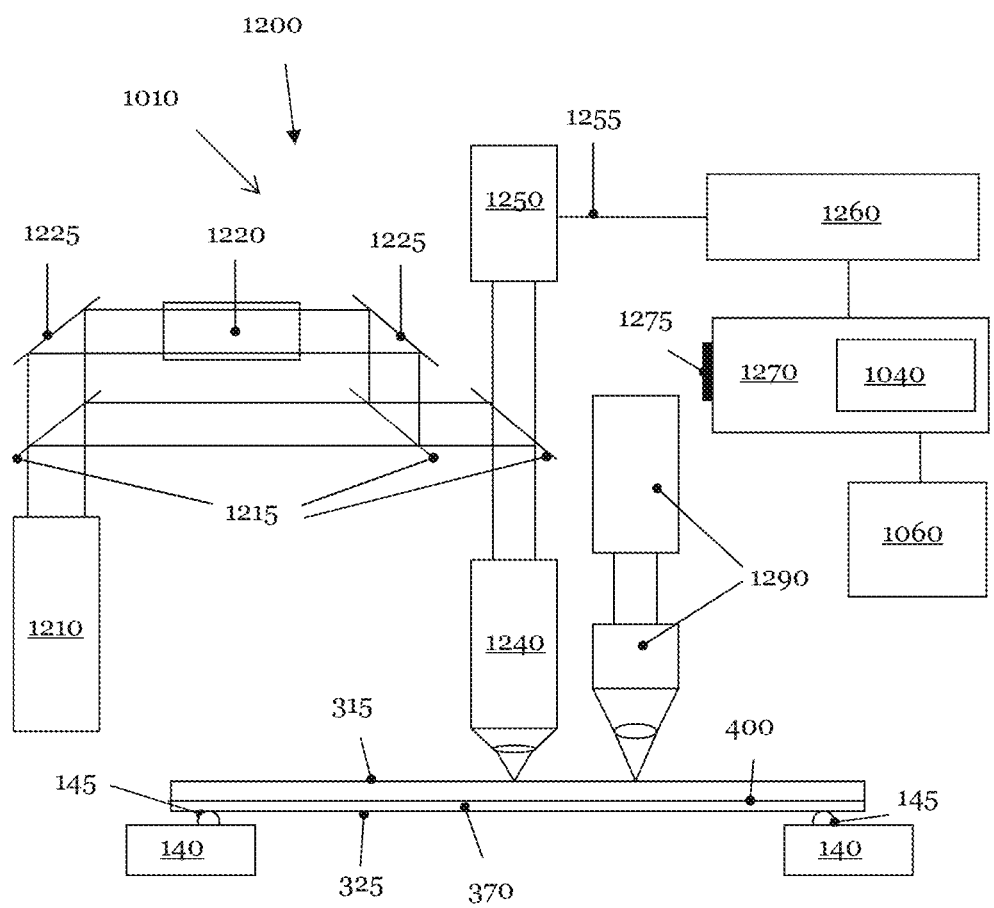
FIG. 13 shows a second exemplary embodiment of the second measuring unit, which can measure both the placement of pattern elements and the unevenness of a rear side of a mask.

FIG. 13 illustrates a third exemplary embodiment of the second means 1020, in which the second measuring unit 1200 from FIG. 12 can also operate as a first measuring unit 1100. In this embodiment, the second measuring unit 1200 has a flipping unit, which can interchange the front side 325 and the rear side 315 of the mask 400. Said flipping unit of the second measuring unit 1200 is not illustrated in FIG. 13. The flipping unit is designed such that it does not contaminate or even damage the front side 315 of the EUV mask 400 during flipping and in particular during mounting on the three-point mount 140.

Since the second measuring unit 1200 has a DUV light source 1110, an autofocus system 1220, an objective 1240 and a detector 1550, it can be used not only for measuring the placements of the pattern elements 350 but also for ascertaining the unevennesses 420 of the rear side 315 of the EUV mask 400.

Figure 14:
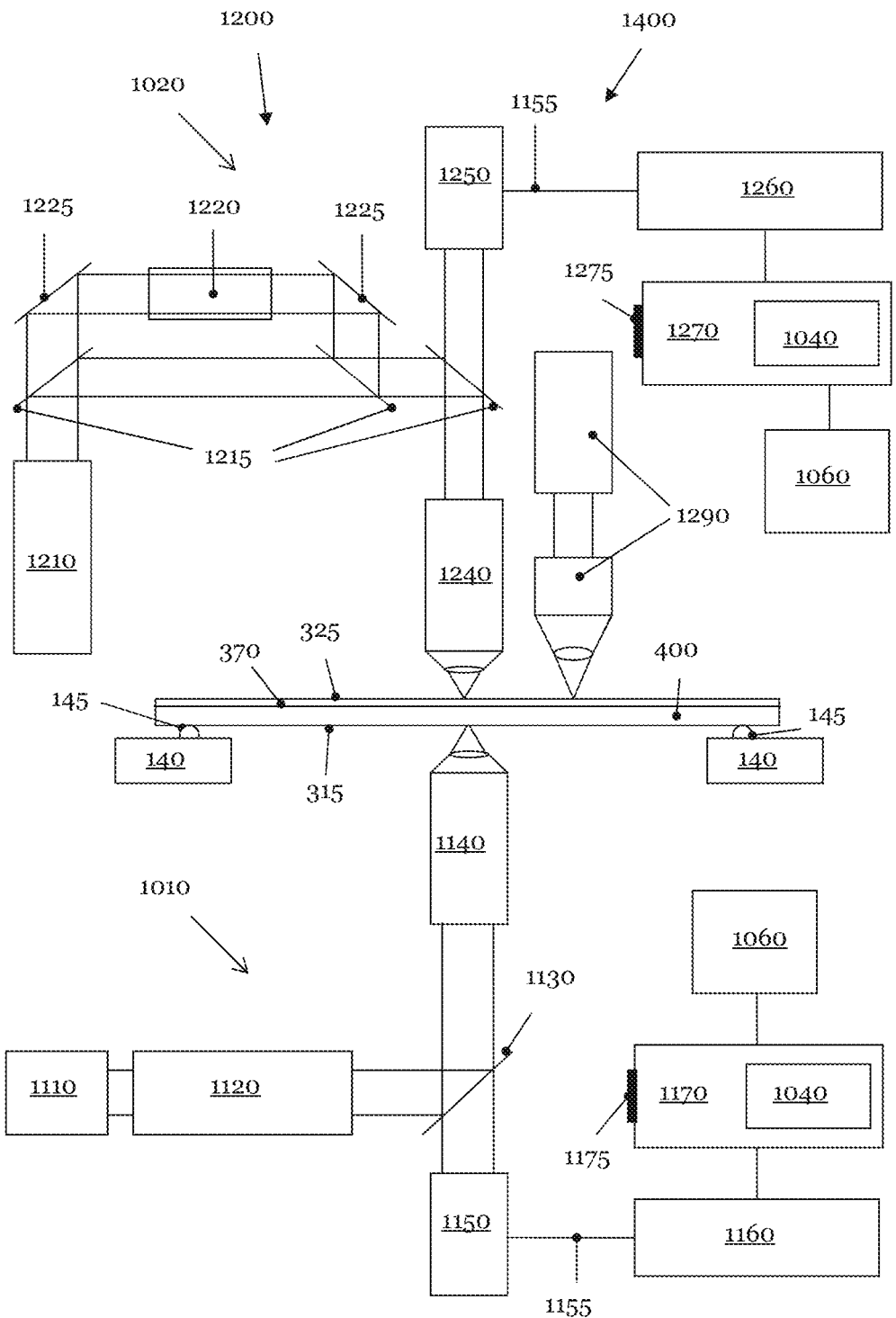
FIG. 14 illustrates a combination device combining a first measuring unit from FIG. 11 and a second measuring unit from FIG. 12.

FIG. 14 shows one exemplary embodiment of a combination device 1400, which combines the first measuring unit 1100 or the first means 1010 and the second measuring unit 1200 or the second means 1020. The combination device 1400 is advantageous since it makes it possible to ascertain the unevennesses 420 of the rear side 315 of the EUV mask 400 and to ascertain the placements of the pattern elements 350, without changing the mounting state of the EUV mask 420. The transformation of the measurement data of the first measuring unit 1100 and of the second measuring unit 1200 into a common reference system or coordinate system is thereby facilitated.

The combination device 1400 reproduced in FIG. 14 has two signal processing systems 1160, 1260 and two computer systems 1170, 1270. It goes without saying that the combination device 1400 manages with one signal processing unit 1260 and one computer system 1270. Furthermore, the combination device 1400 has two light sources 1110 and 1210. It is possible to use one light source 1210 for feeding the two autofocus systems 1120 and 1220. In addition, one of the two autofocus systems 1120, 1220 can be omitted in the combination device 1400.

Figure 15:
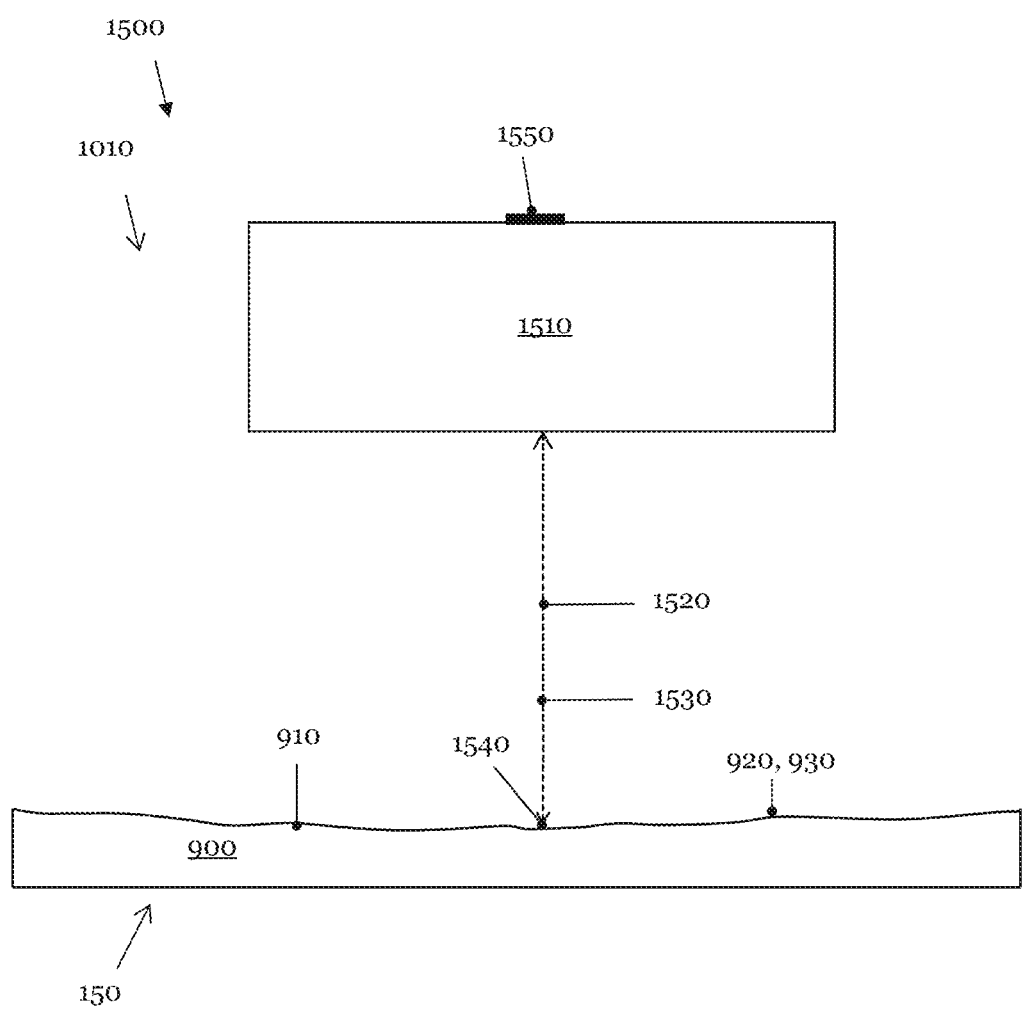
FIG. 15 represents a schematic section through a third measuring unit for measuring unevennesses of a surface of a mount of a reflective photolithographic mask in a measurement environment.

FIG. 15 schematically presents a third exemplary embodiment of the first means 1010 in the form of a third measuring unit 1500. The third measuring unit 1500 is designed to determine the unevennesses 920 of the surface 910 of the mount 900 or of the chuck 900 and to forward the measured data as surface unevenness data 930 to the computing unit 1040 of the device 1000 from FIG. 10. The third measuring unit 1500 typically operates in a measurement environment 150.

The exemplary measuring unit 1500 in FIG. 15 comprises an interferometer 1510, which directs a light beam 1520 onto the surface 910 of the mount 900. The interferometer can comprise a laser interferometer. The radiation 1530 reflected from the surface 910 of the mount 900 is detected by the interferometer 1510. With the aid of the light beams 1520 and 1530, the interferometer 1510 ascertains the distance between the point of incidence 1540 of the light beam 1520 on the surface 920 of the chuck 900 and a reference plane of the interferometer 1500. By scanning the point of incidence 1540 of the light beam over the surface 920 of the chuck 900, it is possible to determine the surface unevenness data 930 thereof. The interferometer 1510 can ascertain the surface 920 with a spatial resolution along the beam axis, i.e. in the z-direction, in the subnanometers range.

As explained in the context of the discussion of FIG. 4, local unevennesses 420 of the rear-side surface of the mask upon the transition from the measurement environment 150 into the operating environment 450 of the EUV mask 400 can lead to a local displacement of the pattern elements 350 thereof. This local displacement of the pattern elements 350 can be at least partly prevented and/or corrected. In this regard, it is possible, for example, by introducing one or more arrangements of pixels into the substrate 310 of the mask in the vicinity of the rear side 312, to smooth the local rear-side unevennesses 420 to the greatest possible extent, with the result that a local lateral displacement of the pattern elements 350 substantially does not occur. Alternatively or additionally, it is possible to introduce one or more arrangements of pixels into the mask substrate 310 in the vicinity of the front side 322 thereof, on which the multilayer structure 370 is deposited. Said last-mentioned arrangement(s) of pixels compensate(s) for the local displacements of the pattern elements 350 that occur upon the transition from the measurement environment 150 into the operating environment 450. Details with regard to determining and introducing arrangements of pixels into a substrate 310 of a mask 400 are specified in the patent specifications U.S. Pat. Nos. 9,658,527 and 9,753,366 in the name of the applicant.

Figure 16:
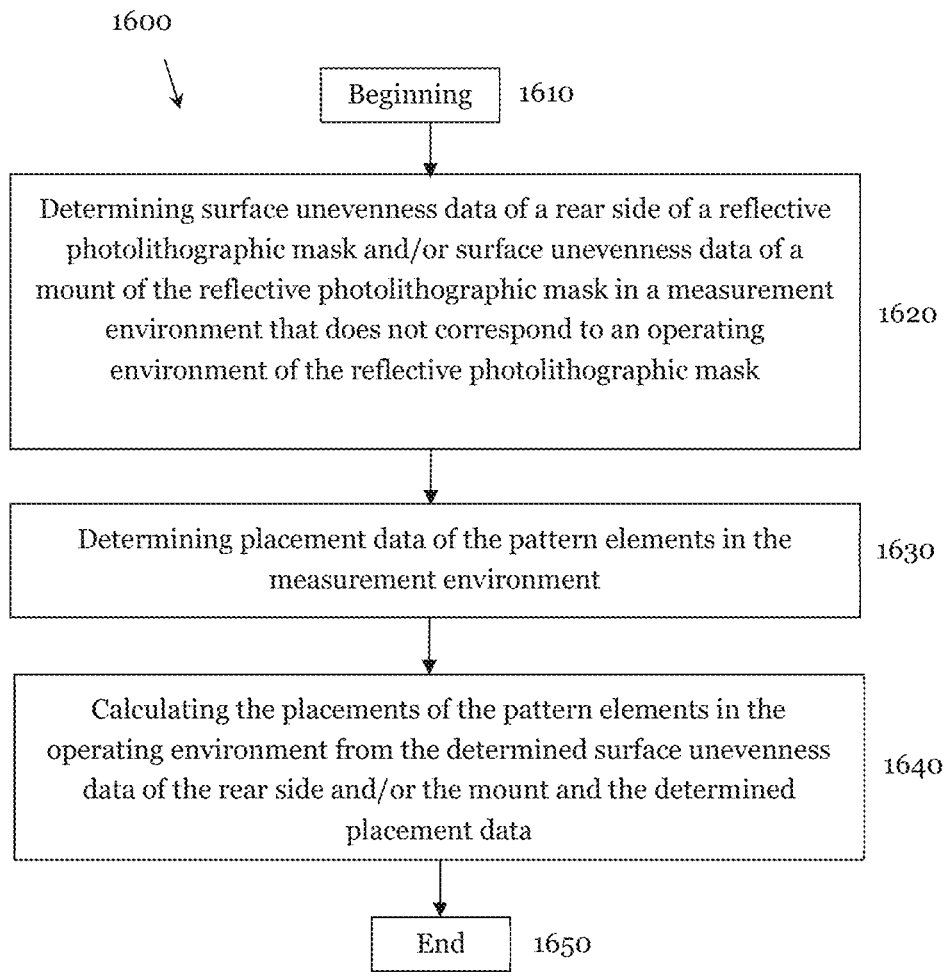
FIG. 16 shows a flow diagram of a method for determining placements of pattern elements of a photolithographic mask, in particular of an EUV mask, in the operating environment thereof.

Finally, the flow diagram 1600 in FIG. 16 gives an overview of the sequence of a method for determining placements of pattern elements 350 of a reflective photolithographic mask 400 in the operating environment 450 thereof. The method begins in step 1610. Step 1620 involves determining surface unevenness data 420 of a rear side 315 of the reflective photolithographic mask 400 and/or surface unevenness data 930 of a mount 900 of the reflective photolithographic mask 400 in a measurement environment 150 that does not correspond to the operating environment 450 of the reflective photolithographic mask 400. This step can be carried out for example by the first measuring unit 1100 and/or by the third measuring unit 1500. The specified method can be carried out by the device 1000.

The next step 1630 involves determining placement data of the pattern elements 350 in the measurement environment 150. The second measuring unit 1200 can carry out this step, for example.

Step 1640 involves calculating the placements of the pattern elements 350 in the operating environment 450 from the determined surface unevenness data 420, 930 of the rear side 315 and/or of the mount 900 and the determined placement data. A computing unit 1040 of the device 1000 is designed to carry out this step. Finally, the method ends with step 1650.

What is claimed is:

1. A device for determining placements of pattern elements of a reflective photolithographic mask in the operating environment thereof, comprising:
   a. at least one first means configured for determining surface unevenness data of a rear side of the reflective photolithographic mask and/or surface unevenness data of a mount of the reflective photolithographic mask when the mask is disposed in a measurement environment that does not correspond to the operating environment of the reflective photolithographic mask;
      wherein the operating environment is located in an exposure system of a lithography device, and the measurement environment is located outside of the operating environment;
   b. at least one second means configured for determining placement data of the pattern elements of the mask when the mask is disposed in the measurement environment; and
   c. at least one computing unit configured for calculating the placements of the pattern elements of the reflective photolithographic mask when the mask is disposed in the operating environment from the determined surface unevenness data of the rear side and/or of the mount and the determined placement data;
      wherein the at least one first means is configured to determine at least one of (i) the surface unevenness data of the rear side of the reflective photolithographic mask held by a first mount in the measurement environment, or (ii) the surface unevenness data of the first mount in the measurement environment;
      wherein the at least one computing unit is configured to calculate the placements of the pattern elements of the reflective photolithographic mask held by a second mount in the operating environment from the determined placement data and at least one of (i) the determined surface unevenness data of the rear side of the reflective photolithographic mask, or (ii) the determined surface unevenness data of the first mount.

2. The device of claim 1, wherein the at least one second means is additionally configured to determine surface unevenness data of a front side of the reflective photolithographic mask, and the computing unit is furthermore configured to take account of the determined surface unevenness data of the front side when calculating the placements of the pattern elements.

3. The device of claim 1, wherein the at least one first means and/or the at least one second means are/is configured to obtain the surface unevenness data of the rear side, of the front side and/or of the mount and also the placements of the pattern elements from one or more external measuring devices.

4. The device of claim 3, wherein the first measuring unit comprises a first light source for a visible wavelength range and/or a second light source for a deep ultraviolet wavelength range.

5. The device of claim 1, wherein the at least one first means comprises a first measuring unit configured for ascertaining the surface unevenness data of the rear side in an environment that does not correspond to the operating environment.

6. The device of claim 5, wherein the second measuring unit comprises a third light source for the visible wavelength range and/or a fourth light source for the deep ultraviolet wavelength range.

7. The device of claim 6, wherein the first measuring unit ascertains the surface unevenness data of the rear side and the second measuring unit ascertains the placement data of the pattern elements without altering a position of the reflective photolithographic mask.

8. The device of claim 7, wherein the computing unit is configured to take account of a deformation of the reflective photolithographic mask on account of the holding of the reflective photolithographic mask in the measurement environment.

9. The device of claim 1, wherein the at least one second means comprises a second measuring unit configured for ascertaining the placement data of the pattern elements in an environment that does not correspond to the operating environment.

10. The device of claim 1, wherein the computing unit is configured to determine the placements of the pattern elements with respect to the mount of the reflective photolithographic mask in the operating environment.

11. The device of claim 1, wherein the computing unit is configured to determine at least one deviation of the placements of the pattern elements with respect to design data in the operating environment.

12. The device of claim 11, wherein the computing unit is furthermore configured to determine from the at least one deviation of the placements of the pattern elements and/or from the determined surface unevenness data at least one arrangement of pixels which corrects the at least one deviation and/or the rear-side surface unevenness.

13. The device of claim 12, further comprising: a laser system configured to introduce the at least one arrangement of pixels into a substrate of the reflective photolithographic mask.

14. The device of claim 1, wherein the computing unit is configured to determine the placements of the pattern elements of the photolithographic mask with respect to an electrostatic chuck with a surface assumed to be ideally flat in the operating environment.

15. The device of claim 14 wherein the at least one first means is configured to determine surface unevenness data of the rear side of the reflective photolithographic mask held by a first mount in the measurement environment, and the first mount has a measurable surface unevenness that is not ideally flat.

16. The device of claim 1, wherein the second measuring unit is configured to radiate substantially perpendicularly onto the front side of the reflective photolithographic mask and the first measuring unit is configured to radiate substantially perpendicularly onto the rear side of the reflective photolithographic mask.

17. The device of claim 1, wherein the device comprises a three-point mount for holding the reflective photolithographic mask.

18. The device of claim 1, wherein the at least one first means comprises at least one element from the group: a distance sensor and an interferometer.

19. The device of claim 1, wherein the computing unit is configured to relate the placements of the pattern elements in the operating environment to a flat surface of a mount of the reflective photolithographic mask in the operating environment.

20. The device of claim 1, wherein the computing unit is configured for determining a gravitation effect of the reflective photolithographic mask during the process of ascertaining the placement data and/or during the process of ascertaining the surface unevenness data.

21. The device of claim 1 wherein the pattern elements are disposed on a front side of the reflective photolithographic mask, and the at least one first means is configured to determine surface unevenness data of the rear side of the reflective photolithographic mask in which the rear side is opposite of the front side;
wherein the surface unevenness data of the rear side of the reflective photolithographic mask represent local deviations of the rear side surface of the reflective photolithographic mask from an average rear side surface of the reflective photolithographic mask.

22. The device of claim 1 wherein the at least one first means comprises at least one first means configured to determine surface unevenness data of a mount of the reflective photolithographic mask in the measurement environment that does not correspond to the operating environment of the reflective photolithographic mask.

23. A method for determining placements of pattern elements of a reflective photolithographic mask in the operating environment thereof, wherein the method comprises the following steps:
a. determining surface unevenness data of a rear side of the reflective photolithographic mask and/or surface unevenness data of a mount of the reflective photolithographic mask when the mask is disposed in a measurement environment that does not correspond to the operating environment of the reflective photolithographic mask;
wherein the operating environment is located in an exposure system of a lithography device, and the measurement environment is located outside of the operating environment;
b. determining placement data of the pattern elements of the mask when the mask is disposed in the measurement environment; and
c. calculating the placements of the pattern elements of the mask when the mask is disposed in the operating environment from the determined surface unevenness data of the rear side and/or of the mount and the determined placement data;
wherein determining surface unevenness data comprises determining at least one of (i) the surface unevenness data of the rear side of the reflective photolithographic mask held by a first mount in the measurement environment, or (ii) the surface unevenness data of the first mount in the measurement environment;
wherein calculating the placements of the pattern elements comprises calculating the placements of the pattern elements of the reflective photolithographic mask held by a second mount in the operating environment from the determined placement data and at least one of (i) the determined surface unevenness data of the rear side of the reflective photolithographic mask, or (ii) the determined surface unevenness data of the first mount.

24. The method of claim 23, wherein determining the surface unevenness data comprises ascertaining the surface unevenness data by use of a first measuring unit, wherein determining the placement data comprises ascertaining the placement data of the pattern elements by use of a second measuring unit, and wherein the surface unevenness data and the placement data are ascertained in a common measurement process.

25. The method of claim 23, wherein determining the surface unevenness data is carried out in a temperature-regulating phase of the reflective photolithographic mask.

26. The method of claim 23, further comprising the step of: introducing at least one arrangement of pixels into a substrate of the reflective photolithographic mask which corrects at least one deviation of the placements of the pattern elements and/or of the rear-side surface unevenness in the operating environment.

27. A computer program containing instructions which, when executed by a computer system, cause the computer system to carry out the method of claim 23.

\* \* \* \* \*

UNITED STATES PATENT AND TRADEMARK OFFICE
CERTIFICATE OF CORRECTION

| | |
|---|---|
| PATENT NO. | : 12,321,091 B2 |
| APPLICATION NO. | : 17/394464 |
| DATED | : June 3, 2025 |
| INVENTOR(S) | : Carola Blaesing-Bangert |

It is certified that error appears in the above-identified patent and that said Letters Patent is hereby corrected as shown below:

On the Title Page

<u>Page 2</u>

Column 2, Line 8, delete "of" and insert -- for --

Column 2, Line 16, delete "EUVI" and insert -- EUV1 --

In the Specification

<u>Column 2</u>
Line 49, delete "75404-11" and insert -- 75404-1 --

<u>Column 15</u>
Line 2, delete "ZERODUIR®" and insert -- ZERODUR® --

<u>Column 19</u>
Line 35 (Approx.), delete "$Z_{Fit}a+b·x+c·y+d·x·y+e·x^2+f·y^2$." and insert
-- $Z_{Fit}=a+b·x+c·y+d·x·y+e·x^2+f·y^2$. --

Line 46 (Approx.), delete "mask:" and insert -- mask. --

Signed and Sealed this
Second Day of December, 2025

John A. Squires
*Director of the United States Patent and Trademark Office*